United States Patent
Stoner et al.

(10) Patent No.: US 8,944,831 B2
(45) Date of Patent: Feb. 3, 2015

(54) ELECTRICAL CONNECTOR HAVING RIBBED GROUND PLATE WITH ENGAGEMENT MEMBERS

(71) Applicants: Stuart C. Stoner, Lweisberry, PA (US); Douglas M. Johnescu, York, PA (US); Jonathan E. Buck, Hershey, PA (US)

(72) Inventors: Stuart C. Stoner, Lweisberry, PA (US); Douglas M. Johnescu, York, PA (US); Jonathan E. Buck, Hershey, PA (US)

(73) Assignee: FCI Americas Technology LLC, Carson City, NV (US)

( * ) Notice: Subject to any disclaimer, the term of this patent is extended or adjusted under 35 U.S.C. 154(b) by 126 days.

(21) Appl. No.: 13/832,096

(22) Filed: Mar. 15, 2013

(65) Prior Publication Data

US 2013/0273756 A1    Oct. 17, 2013

Related U.S. Application Data

(60) Provisional application No. 61/624,238, filed on Apr. 13, 2012.

(51) Int. Cl.
| | |
|---|---|
| *H01R 4/66* | (2006.01) |
| *H01R 13/658* | (2011.01) |
| *H05K 3/40* | (2006.01) |
| *H01R 13/6587* | (2011.01) |
| *H01R 12/73* | (2011.01) |
| *H01R 13/6582* | (2011.01) |

(52) U.S. Cl.
CPC ............ *H01R 13/658* (2013.01); *H05K 3/4038* (2013.01); *H01R 13/6587* (2013.01); *H01R 12/737* (2013.01); *H01R 13/6582* (2013.01)
USPC .......................................................... 439/108

(58) Field of Classification Search
USPC ................ 439/108, 660, 489, 541.5, 607.01, 439/607.23, 607.4, 638–639, 686, 680, 939, 439/852
See application file for complete search history.

(56) References Cited

U.S. PATENT DOCUMENTS

| | | |
|---|---|---|
| 318,186 A | 5/1885 | Hertzog |
| 741,052 A | 10/1903 | Mahon |

(Continued)

FOREIGN PATENT DOCUMENTS

| | | |
|---|---|---|
| DE | 1665181 | 4/1974 |
| DE | 3529218 | 2/1986 |

(Continued)

OTHER PUBLICATIONS

Berg Electronics Catalog, p. 13-96, Solder Washers, 1996, 1 page.

(Continued)

*Primary Examiner* — Jean F Duverne
(74) *Attorney, Agent, or Firm* — Baker & Hostetler LLP

(57) ABSTRACT

An electrical connector includes a dielectric housing, a plurality of electrical signal contacts supported by the dielectric housing, and an electrically conductive ground plate supported by the dielectric housing. The dielectric hosing defines at least one protrusion, and the ground plate defines at least one aperture that receives the protrusion. The apertures can define a first dimension along a select direction and a second dimension along the select direction, wherein the first dimension is greater than the second dimension so as to define a lead-in for the protrusion. The protrusion can be press-fit to the electrically conductive ground plate at the second dimension of the aperture so as to secure the ground plate to the dielectric housing.

44 Claims, 8 Drawing Sheets

(56) References Cited

U.S. PATENT DOCUMENTS

| | | |
|---|---|---|
| 1,477,527 A | 12/1923 | Raettig |
| D86,515 S | 3/1932 | Cox |
| 2,231,347 A | 2/1941 | Reutter |
| 2,248,675 A | 7/1941 | Huppert |
| 2,430,011 A | 11/1947 | Gillentine |
| 2,664,552 A | 12/1953 | Ericsson et al. |
| 2,759,163 A | 8/1956 | Ustin et al. |
| 2,762,022 A | 9/1956 | Benander et al. |
| 2,849,700 A | 4/1958 | Perkin |
| 2,844,644 A | 7/1958 | Soule, Jr. |
| 2,858,372 A | 10/1958 | Kaufman |
| 3,011,143 A | 11/1961 | Dean |
| 3,115,379 A | 12/1963 | McKee |
| 3,178,669 A | 4/1965 | Roberts |
| 3,179,738 A | 4/1965 | De Lyon |
| 3,208,030 A | 9/1965 | Evans et al. |
| 3,286,220 A | 11/1966 | Marley et al. |
| 3,320,658 A | 5/1967 | Bolda et al. |
| 3,343,120 A | 9/1967 | Whiting |
| 3,366,729 A | 1/1968 | Pauza |
| 3,411,127 A | 11/1968 | Adams |
| 3,420,087 A | 1/1969 | Hatfield. et al. |
| D213,697 S | 4/1969 | Oxley |
| 3,482,201 A | 12/1969 | Schneck |
| 3,514,740 A | 5/1970 | Filson et al. |
| 3,538,486 A | 11/1970 | Shlesinger, Jr. |
| 3,560,908 A | 2/1971 | Dell et al. |
| 3,591,834 A | 7/1971 | Kolias |
| 3,634,811 A | 1/1972 | Teagno et al. |
| 3,641,475 A | 2/1972 | Irish et al. |
| 3,663,925 A | 5/1972 | Proctor |
| 3,669,054 A | 6/1972 | Desso et al. |
| 3,692,994 A | 9/1972 | Hirschman et al. |
| 3,701,076 A | 10/1972 | Irish |
| 3,719,981 A | 3/1973 | Steitz |
| 3,732,697 A | 5/1973 | Dickson |
| 3,748,633 A | 7/1973 | Lundergan |
| 3,827,005 A | 7/1974 | Friend |
| 3,845,451 A | 10/1974 | Neidecker |
| 3,864,004 A | 2/1975 | Friend |
| 3,865,462 A | 2/1975 | Cobaugh et al. |
| 3,867,008 A | 2/1975 | Gartland, Jr. |
| 3,871,015 A | 3/1975 | Lin et al. |
| 3,889,364 A | 6/1975 | Krueger |
| 3,942,856 A | 3/1976 | Mindheim et al. |
| 3,972,580 A | 8/1976 | Pemberton et al. |
| 4,030,792 A | 6/1977 | Fuerst |
| 4,056,302 A | 11/1977 | Braun et al. |
| 4,070,088 A | 1/1978 | Vaden |
| 4,076,362 A | 2/1978 | Ichimura |
| 4,082,407 A | 4/1978 | Smorzaniuk et al. |
| 4,097,266 A | 6/1978 | Takahashi et al. |
| 4,136,919 A | 1/1979 | Howard et al. |
| 4,140,361 A | 2/1979 | Sochor |
| 4,159,861 A | 7/1979 | Anhalt |
| 4,217,024 A | 8/1980 | Aldridge et al. |
| 4,232,924 A | 11/1980 | Kline et al. |
| 4,260,212 A | 4/1981 | Ritchie et al. |
| 4,274,700 A | 6/1981 | Keglewitsch et al. |
| 4,288,139 A | 9/1981 | Cobaugh et al. |
| 4,371,912 A | 2/1983 | Guzik |
| 4,380,518 A | 4/1983 | Wydro, Sr. |
| 4,383,724 A | 5/1983 | Verhoeven |
| 4,395,086 A | 7/1983 | Marsh |
| 4,396,140 A | 8/1983 | Jaffe et al. |
| 4,402,563 A | 9/1983 | Sinclair |
| 4,403,821 A | 9/1983 | Zimmerman et al. |
| 4,448,467 A | 5/1984 | Weidler |
| 4,462,534 A | 7/1984 | Bitaillou et al. |
| 4,464,003 A | 8/1984 | Goodman et al. |
| 4,473,113 A | 9/1984 | Whitfield et al. |
| 4,473,477 A | 9/1984 | Beall |
| D275,849 S | 10/1984 | Sakurai |
| 4,482,937 A | 11/1984 | Berg |
| 4,505,529 A | 3/1985 | Barkus |
| 4,523,296 A | 6/1985 | Healy, Jr. |
| 4,533,187 A | 8/1985 | Kirkman |
| 4,536,955 A | 8/1985 | Gudgeon |
| 4,545,610 A | 10/1985 | Lakritz et al. |
| 4,552,425 A | 11/1985 | Billman |
| 4,560,222 A | 12/1985 | Dambach |
| 4,564,259 A | 1/1986 | Vandame |
| 4,592,846 A | 6/1986 | Metzger et al. |
| 4,596,428 A | 6/1986 | Tengler |
| 4,596,433 A | 6/1986 | Oesterheld et al. |
| 4,624,604 A | 11/1986 | Wagner et al. |
| 4,632,476 A | 12/1986 | Schell |
| 4,641,426 A | 2/1987 | Hartman et al. |
| 4,655,515 A | 4/1987 | Hamsher, Jr. et al. |
| 4,664,309 A | 5/1987 | Allen et al. |
| 4,664,456 A | 5/1987 | Blair et al. |
| 4,664,458 A | 5/1987 | Worth |
| 4,678,250 A | 7/1987 | Romine et al. |
| 4,685,886 A | 8/1987 | Denlinger et al. |
| 4,705,205 A | 11/1987 | Allen et al. |
| 4,705,332 A | 11/1987 | Sadigh-Behzadi |
| 4,717,360 A | 1/1988 | Czaja |
| 4,722,470 A | 2/1988 | Johary |
| 4,762,500 A | 8/1988 | Dola et al. |
| 4,767,344 A | 8/1988 | Noschese |
| 4,776,803 A | 10/1988 | Pretchel et al. |
| 4,782,893 A | 11/1988 | Thomas |
| 4,790,763 A | 12/1988 | Weber et al. |
| 4,806,107 A | 2/1989 | Arnold et al. |
| 4,815,987 A | 3/1989 | Kawano et al. |
| 4,818,237 A | 4/1989 | Weber |
| 4,820,169 A | 4/1989 | Weber et al. |
| 4,820,182 A | 4/1989 | Harwath et al. |
| 4,824,383 A | 4/1989 | Lemke |
| 4,830,264 A | 5/1989 | Bitaillou et al. |
| 4,836,791 A | 6/1989 | Grabbe et al. |
| 4,844,813 A | 7/1989 | Helfgott et al. |
| 4,846,727 A | 7/1989 | Glover et al. |
| 4,850,887 A | 7/1989 | Sugawara |
| 4,854,899 A | 8/1989 | Matthews |
| 4,867,713 A | 9/1989 | Ozu et al. |
| 4,871,110 A | 10/1989 | Fukasawa et al. |
| 4,878,611 A | 11/1989 | LoVasco et al. |
| 4,881,905 A | 11/1989 | Demler et al. |
| 4,882,554 A | 11/1989 | Akaba et al. |
| 4,884,335 A | 12/1989 | McCoy et al. |
| 4,898,539 A | 2/1990 | Glover et al. |
| 4,900,271 A | 2/1990 | Colleran et al. |
| 4,904,212 A | 2/1990 | Durbin et al. |
| 4,907,990 A | 3/1990 | Bertho et al. |
| 4,908,129 A | 3/1990 | Finsterwalder et al. |
| 4,913,664 A | 4/1990 | Dixon et al. |
| 4,915,641 A | 4/1990 | Miskin et al. |
| 4,917,616 A | 4/1990 | Demler, Jr. et al. |
| 4,952,172 A | 8/1990 | Barkus et al. |
| 4,963,102 A | 10/1990 | Gettig et al. |
| 4,965,699 A | 10/1990 | Jorden et al. |
| 4,973,257 A | 11/1990 | Lhotak |
| 4,973,271 A | 11/1990 | Ishizuka et al. |
| 4,974,119 A | 11/1990 | Martin |
| 4,975,069 A | 12/1990 | Fedder et al. |
| 4,975,084 A | 12/1990 | Fedder et al. |
| 4,979,074 A | 12/1990 | Morley et al. |
| 4,997,390 A | 3/1991 | Scholz et al. |
| 5,004,426 A | 4/1991 | Barnett |
| 5,016,968 A | 5/1991 | Hammond et al. |
| 5,024,372 A | 6/1991 | Altman et al. |
| 5,024,610 A | 6/1991 | French et al. |
| 5,035,631 A | 7/1991 | Piorunneck et al. |
| 5,035,639 A | 7/1991 | Kilpatrick et al. |
| 5,046,960 A | 9/1991 | Fedder et al. |
| 5,052,953 A | 10/1991 | Weber |
| 5,055,054 A | 10/1991 | Doutrich |
| 5,060,844 A | 10/1991 | Behun et al. |
| 5,065,282 A | 11/1991 | Polonio |
| 5,066,236 A | 11/1991 | Broeksteeg |
| 5,077,893 A | 1/1992 | Mosquera et al. |
| 5,082,459 A | 1/1992 | Billman et al. |
| 5,083,238 A | 1/1992 | Bousman |

(56) References Cited

U.S. PATENT DOCUMENTS

| | | |
|---|---|---|
| 5,093,986 A | 3/1992 | Mandai et al. |
| 5,094,623 A | 3/1992 | Scharf et al. |
| 5,094,634 A | 3/1992 | Dixon et al. |
| 5,098,311 A | 3/1992 | Roath et al. |
| 5,104,332 A | 4/1992 | McCoy |
| 5,104,341 A | 4/1992 | Gilissen et al. |
| 5,111,991 A | 5/1992 | Clawson et al. |
| 5,117,331 A | 5/1992 | Gebara |
| 5,118,027 A | 6/1992 | Braun et al. |
| 5,120,237 A | 6/1992 | Fussell |
| 5,127,839 A | 7/1992 | Korsunsky et al. |
| 5,131,871 A | 7/1992 | Banakis et al. |
| 5,137,959 A | 8/1992 | Block et al. |
| 5,139,426 A | 8/1992 | Barkus et al. |
| 5,145,104 A | 9/1992 | Apap et al. |
| 5,151,056 A | 9/1992 | McClune |
| 5,152,700 A | 10/1992 | Bogursky et al. |
| 5,161,987 A | 11/1992 | Sinisi |
| 5,163,337 A | 11/1992 | Herron et al. |
| 5,163,849 A | 11/1992 | Fogg et al. |
| 5,167,528 A | 12/1992 | Nishiyama et al. |
| 5,169,337 A | 12/1992 | Ortega et al. |
| 5,174,770 A | 12/1992 | Sasaki et al. |
| 5,181,855 A | 1/1993 | Mosquera et al. |
| 5,194,480 A | 3/1993 | Block et al. |
| 5,199,885 A | 4/1993 | Korsunsky et al. |
| 5,203,075 A | 4/1993 | Angulas et al. |
| 5,207,372 A | 5/1993 | Funari et al. |
| 5,213,868 A | 5/1993 | Liberty et al. |
| 5,214,308 A | 5/1993 | Nishiguchi |
| 5,217,381 A | 6/1993 | Zell et al. |
| 5,222,649 A | 6/1993 | Funari et al. |
| 5,224,867 A | 7/1993 | Ohtsuki et al. |
| 5,228,864 A | 7/1993 | Fusselman et al. |
| 5,229,016 A | 7/1993 | Hayes et al. |
| 5,238,414 A | 8/1993 | Yaegashi et al. |
| 5,254,012 A | 10/1993 | Wang |
| 5,255,839 A | 10/1993 | Da Costa Alves et al. |
| 5,257,941 A | 11/1993 | Lwee et al. |
| 5,261,155 A | 11/1993 | Angulas et al. |
| 5,269,453 A | 12/1993 | Melton et al. |
| 5,274,918 A | 1/1994 | Reed |
| 5,275,330 A | 1/1994 | Isaacs et al. |
| 5,276,964 A | 1/1994 | Anderson, Jr. et al. |
| 5,277,624 A | 1/1994 | Champion et al. |
| 5,284,287 A | 2/1994 | Wilson et al. |
| 5,285,163 A | 2/1994 | Liotta |
| 5,286,212 A | 2/1994 | Broeksteeg |
| 5,288,949 A | 2/1994 | Crafts |
| 5,295,843 A | 3/1994 | Davis et al. |
| 5,298,791 A | 3/1994 | Liberty et al. |
| 5,302,135 A | 4/1994 | Lee |
| 5,321,582 A | 6/1994 | Casperson |
| 5,324,569 A | 6/1994 | Nagesh et al. |
| 5,342,211 A | 8/1994 | Broeksteeg |
| 5,344,327 A | 9/1994 | Brunker et al. |
| 5,346,118 A | 9/1994 | Degani et al. |
| 5,354,219 A | 10/1994 | Wanjura |
| 5,355,283 A | 10/1994 | Marrs et al. |
| 5,356,300 A | 10/1994 | Costello et al. |
| 5,356,301 A | 10/1994 | Champion et al. |
| 5,357,050 A | 10/1994 | Baran et al. |
| 5,358,417 A | 10/1994 | Schmedding |
| 5,377,902 A | 1/1995 | Hayes |
| 5,381,314 A | 1/1995 | Rudy, Jr. et al. |
| 5,382,168 A | 1/1995 | Azuma et al. |
| D355,409 S | 2/1995 | Krokaugger |
| 5,387,111 A | 2/1995 | DeSantis et al. |
| 5,387,139 A | 2/1995 | McKee et al. |
| 5,395,250 A | 3/1995 | Englert, Jr. et al. |
| 5,400,949 A | 3/1995 | Hirvonen et al. |
| 5,403,206 A | 4/1995 | McNamara et al. |
| 5,409,157 A | 4/1995 | Nagesh et al. |
| 5,410,807 A | 5/1995 | Bross et al. |
| 5,427,543 A | 6/1995 | Dynia |
| 5,429,520 A | 7/1995 | Morlion et al. |
| 5,429,521 A | 7/1995 | Morlion et al. |
| 5,431,332 A | 7/1995 | Kirby et al. |
| 5,431,578 A | 7/1995 | Wayne |
| 5,433,617 A | 7/1995 | Morlion et al. |
| 5,433,618 A | 7/1995 | Morlion et al. |
| 5,435,482 A | 7/1995 | Variot et al. |
| 5,442,852 A | 8/1995 | Danner |
| 5,445,313 A | 8/1995 | Boyd et al. |
| 5,457,342 A | 10/1995 | Herbst, II |
| 5,458,426 A | 10/1995 | Ito |
| 5,462,456 A | 10/1995 | Howell |
| 5,467,913 A | 11/1995 | Namekawa et al. |
| 5,474,472 A | 12/1995 | Niwa et al. |
| 5,475,922 A | 12/1995 | Tamura et al. |
| 5,477,933 A | 12/1995 | Nguyen |
| 5,489,750 A | 2/1996 | Sakemi et al. |
| 5,490,040 A | 2/1996 | Gavdenzi et al. |
| 5,491,303 A | 2/1996 | Weiss |
| 5,492,266 A | 2/1996 | Hoebener et al. |
| 5,495,668 A | 3/1996 | Furusawa et al. |
| 5,496,183 A | 3/1996 | Soes et al. |
| 5,498,167 A | 3/1996 | Seto et al. |
| 5,499,487 A | 3/1996 | McGill |
| 5,504,277 A | 4/1996 | Danner |
| 5,511,987 A | 4/1996 | Shinchi |
| 5,512,519 A | 4/1996 | Hwang |
| 5,516,030 A | 5/1996 | Denton |
| 5,516,032 A | 5/1996 | Sakemi et al. |
| 5,518,410 A | 5/1996 | Masami |
| 5,519,580 A | 5/1996 | Natarajan et al. |
| 5,522,727 A | 6/1996 | Saito et al. |
| 5,533,915 A | 7/1996 | Deans |
| 5,534,127 A | 7/1996 | Sakai |
| 5,539,153 A | 7/1996 | Schwiebert et al. |
| 5,542,174 A | 8/1996 | Chiu |
| 5,558,542 A | 9/1996 | O'Sullivan et al. |
| 5,564,952 A | 10/1996 | Davis et al. |
| 5,575,688 A | 11/1996 | Crane, Jr. |
| 5,577,928 A | 11/1996 | Duclos |
| 5,580,283 A | 12/1996 | O'Sullivan et al. |
| 5,586,908 A | 12/1996 | Lorrain |
| 5,586,914 A | 12/1996 | Foster, Jr. et al. |
| 5,588,859 A | 12/1996 | Maurice |
| 5,590,463 A | 1/1997 | Feldman et al. |
| 5,591,118 A | 1/1997 | Bierck |
| 5,591,941 A | 1/1997 | Acocella et al. |
| 5,593,322 A | 1/1997 | Swamy et al. |
| 5,605,417 A | 2/1997 | Englert et al. |
| 5,609,502 A | 3/1997 | Thumma |
| 5,613,882 A | 3/1997 | Hnatuck et al. |
| 5,618,187 A | 4/1997 | Goto |
| 5,634,821 A | 6/1997 | Crane, Jr. |
| 5,637,008 A | 6/1997 | Kozel |
| 5,637,019 A | 6/1997 | Crane, Jr. et al. |
| 5,643,009 A | 7/1997 | Dinkel et al. |
| 5,664,968 A | 9/1997 | Mickievicz |
| 5,664,973 A | 9/1997 | Emmert et al. |
| 5,667,392 A | 9/1997 | Kocher et al. |
| 5,672,064 A | 9/1997 | Provencher et al. |
| 5,691,041 A | 11/1997 | Frankeny et al. |
| D387,733 S | 12/1997 | Lee |
| 5,697,799 A | 12/1997 | Consoli et al. |
| 5,702,255 A | 12/1997 | Murphy et al. |
| 5,713,746 A | 2/1998 | Olson et al. |
| 5,718,606 A | 2/1998 | Rigby et al. |
| 5,727,963 A | 3/1998 | LeMaster |
| 5,730,609 A | 3/1998 | Harwath |
| 5,733,453 A | 3/1998 | DeBusk |
| 5,741,144 A | 4/1998 | Elco et al. |
| 5,741,161 A | 4/1998 | Cahaly et al. |
| 5,742,484 A | 4/1998 | Gillette et al. |
| 5,743,009 A | 4/1998 | Matsui et al. |
| 5,743,765 A | 4/1998 | Andrews et al. |
| 5,745,349 A | 4/1998 | Lemke |
| 5,746,608 A | 5/1998 | Taylor |
| 5,749,746 A | 5/1998 | Tan et al. |
| 5,755,595 A | 5/1998 | Davis et al. |
| 5,766,023 A | 6/1998 | Noschese et al. |

(56) References Cited

U.S. PATENT DOCUMENTS

| | | |
|---|---|---|
| 5,772,451 A | 6/1998 | Dozier, II et al. |
| 5,782,644 A | 7/1998 | Kiat |
| 5,787,971 A | 8/1998 | Dodson |
| 5,795,191 A | 8/1998 | Preputnick et al. |
| 5,810,607 A | 9/1998 | Shih et al. |
| 5,817,973 A | 10/1998 | Elco et al. |
| 5,827,094 A | 10/1998 | Aizawa et al. |
| 5,831,314 A | 11/1998 | Wen |
| 5,833,475 A | 11/1998 | Mitra |
| 5,846,024 A | 12/1998 | Mao et al. |
| 5,851,121 A | 12/1998 | Thenaisie et al. |
| 5,853,797 A | 12/1998 | Fuchs et al. |
| 5,857,857 A | 1/1999 | Fukuda |
| 5,860,816 A | 1/1999 | Provencher et al. |
| 5,871,362 A | 2/1999 | Campbell et al. |
| 5,874,776 A | 2/1999 | Kresge et al. |
| 5,876,219 A | 3/1999 | Taylor et al. |
| 5,876,222 A | 3/1999 | Gardner et al. |
| 5,876,248 A | 3/1999 | Brunker et al. |
| 5,882,214 A | 3/1999 | Hillbish et al. |
| 5,883,782 A | 3/1999 | Thurston et al. |
| 5,887,158 A | 3/1999 | Sample et al. |
| 5,888,884 A | 3/1999 | Wojnarowski |
| 5,892,791 A | 4/1999 | Moon |
| 5,893,761 A | 4/1999 | Longueville |
| 5,902,136 A | 5/1999 | Lemke et al. |
| 5,904,581 A | 5/1999 | Pope et al. |
| 5,908,333 A | 6/1999 | Perino et al. |
| 5,913,702 A | 6/1999 | Garcin |
| 5,919,050 A | 7/1999 | Kehley et al. |
| 5,930,114 A | 7/1999 | Kuzmin et al. |
| 5,938,479 A | 8/1999 | Paulson et al. |
| 5,943,770 A | 8/1999 | Thenaisie et al. |
| 5,955,888 A | 9/1999 | Frederickson et al. |
| 5,961,355 A | 10/1999 | Morlion et al. |
| 5,967,844 A | 10/1999 | Doutrich et al. |
| 5,971,817 A | 10/1999 | Longueville |
| 5,975,921 A | 11/1999 | Shuey |
| 5,980,270 A | 11/1999 | Fjelstad et al. |
| 5,980,321 A | 11/1999 | Cohen et al. |
| 5,982,249 A | 11/1999 | Bruns |
| 5,984,690 A | 11/1999 | Riechelmann et al. |
| 5,984,726 A | 11/1999 | Wu |
| 5,992,953 A | 11/1999 | Rabinovitz |
| 5,993,259 A | 11/1999 | Stokoe et al. |
| 6,012,948 A | 1/2000 | Wu |
| 6,022,227 A | 2/2000 | Huang |
| 6,024,584 A | 2/2000 | Lemke et al. |
| 6,027,381 A | 2/2000 | Lok |
| 6,036,549 A | 3/2000 | Wulff |
| 6,041,498 A | 3/2000 | Hillbish et al. |
| 6,042,389 A | 3/2000 | Lemke et al. |
| 6,042,394 A | 3/2000 | Mitra et al. |
| 6,042,427 A | 3/2000 | Adriaenssens et al. |
| 6,050,842 A | 4/2000 | Ferrill et al. |
| 6,050,862 A | 4/2000 | Ishii |
| 6,053,751 A | 4/2000 | Humphrey |
| 6,059,170 A | 5/2000 | Jimarez et al. |
| 6,066,048 A | 5/2000 | Lees |
| 6,068,520 A | 5/2000 | Winings et al. |
| 6,071,152 A | 6/2000 | Achammer et al. |
| 6,077,130 A | 6/2000 | Hughes et al. |
| 6,083,047 A | 7/2000 | Paagman |
| 6,086,386 A | 7/2000 | Fjelstad et al. |
| 6,089,878 A | 7/2000 | Meng |
| 6,095,827 A | 8/2000 | Dutkowsky et al. |
| 6,113,418 A | 9/2000 | Kjeldahl |
| 6,116,926 A | 9/2000 | Ortega et al. |
| 6,116,965 A | 9/2000 | Arnett et al. |
| 6,123,554 A | 9/2000 | Ortega et al. |
| 6,125,535 A | 10/2000 | Chiou et al. |
| 6,129,592 A | 10/2000 | Mickievicz et al. |
| 6,132,255 A | 10/2000 | Verhoeven |
| 6,139,336 A | 10/2000 | Olson |
| 6,146,157 A | 11/2000 | Lenoir et al. |
| 6,146,202 A | 11/2000 | Ramey et al. |
| 6,146,203 A | 11/2000 | Elco et al. |
| 6,152,747 A | 11/2000 | McNamara |
| 6,152,756 A | 11/2000 | Huang et al. |
| 6,154,742 A | 11/2000 | Herriot |
| 6,171,115 B1 | 1/2001 | Mickievicz et al. |
| 6,171,149 B1 | 1/2001 | Van Zanten |
| 6,174,198 B1 | 1/2001 | Wu et al. |
| 6,179,663 B1 | 1/2001 | Bradley et al. |
| 6,180,891 B1 | 1/2001 | Murdeshwar |
| 6,183,287 B1 | 2/2001 | Po |
| 6,183,301 B1 | 2/2001 | Paagman |
| 6,190,213 B1 | 2/2001 | Reichart et al. |
| 6,193,537 B1 | 2/2001 | Harper, Jr. et al. |
| 6,196,871 B1 | 3/2001 | Szu |
| 6,202,916 B1 | 3/2001 | Updike et al. |
| 6,206,722 B1 | 3/2001 | Ko et al. |
| 6,206,735 B1 | 3/2001 | Zanoli |
| 6,210,197 B1 | 4/2001 | Yu |
| 6,210,240 B1 | 4/2001 | Comerci et al. |
| 6,212,755 B1 | 4/2001 | Shimada et al. |
| 6,215,180 B1 | 4/2001 | Chen et al. |
| 6,219,913 B1 | 4/2001 | Uchiyama |
| 6,220,884 B1 | 4/2001 | Lin |
| 6,220,895 B1 | 4/2001 | Lin |
| 6,220,896 B1 | 4/2001 | Bertoncini et al. |
| 6,227,882 B1 | 5/2001 | Ortega et al. |
| 6,231,391 B1 | 5/2001 | Ramey et al. |
| 6,234,851 B1 | 5/2001 | Phillips |
| 6,238,225 B1 | 5/2001 | Middlehurst et al. |
| 6,241,535 B1 | 6/2001 | Lemke et al. |
| 6,244,887 B1 | 6/2001 | Commerci et al. |
| 6,257,478 B1 | 7/2001 | Straub |
| 6,259,039 B1 | 7/2001 | Chroneos, Jr. et al. |
| 6,261,132 B1 | 7/2001 | Koseki et al. |
| 6,267,604 B1 | 7/2001 | Mickievicz et al. |
| 6,269,539 B1 | 8/2001 | Takahashi et al. |
| 6,274,474 B1 | 8/2001 | Caletka et al. |
| 6,280,209 B1 | 8/2001 | Bassler et al. |
| 6,280,230 B1 | 8/2001 | Takase et al. |
| 6,280,809 B1 | 8/2001 | Wang et al. |
| 6,290,552 B1 | 9/2001 | Saito et al. |
| 6,293,827 B1 | 9/2001 | Stokoe et al. |
| 6,299,483 B1 | 10/2001 | Cohen et al. |
| 6,299,484 B2 | 10/2001 | Van Woensel et al. |
| 6,299,492 B1 | 10/2001 | Pierini et al. |
| 6,302,711 B1 | 10/2001 | Ito |
| 6,309,245 B1 | 10/2001 | Sweeney |
| 6,319,075 B1 | 11/2001 | Clark et al. |
| 6,322,377 B2 | 11/2001 | Middlehurst et al. |
| 6,322,379 B1 | 11/2001 | Ortega et al. |
| 6,322,393 B1 | 11/2001 | Doutrich et al. |
| 6,328,602 B1 | 12/2001 | Yamasaki et al. |
| 6,338,635 B1 | 1/2002 | Lee |
| 6,343,955 B2 | 2/2002 | Billman et al. |
| 6,347,952 B1 | 2/2002 | Hasegawa et al. |
| 6,347,962 B1 | 2/2002 | Kline |
| 6,350,134 B1 | 2/2002 | Fogg et al. |
| 6,354,877 B1 | 3/2002 | Shuey et al. |
| 6,358,061 B1 | 3/2002 | Regnier |
| 6,359,783 B1 | 3/2002 | Noble |
| 6,360,940 B1 | 3/2002 | Bolde et al. |
| 6,361,366 B1 | 3/2002 | Shuey et al. |
| 6,361,376 B1 | 3/2002 | Onoda |
| 6,362,961 B1 | 3/2002 | Chiou |
| 6,363,607 B1 | 4/2002 | Chen et al. |
| 6,364,710 B1 | 4/2002 | Billman et al. |
| 6,371,773 B1 | 4/2002 | Crofoot et al. |
| 6,371,813 B2 | 4/2002 | Ramey et al. |
| 6,375,478 B1 | 4/2002 | Kikuchi |
| 6,375,508 B1 | 4/2002 | Pickles et al. |
| 6,379,188 B1 | 4/2002 | Cohen et al. |
| 6,386,914 B1 | 5/2002 | Collins et al. |
| 6,386,924 B2 | 5/2002 | Long |
| 6,390,826 B1 | 5/2002 | Affolter et al. |
| 6,394,818 B1 | 5/2002 | Smalley, Jr. |
| 6,402,566 B1 | 6/2002 | Middlehurst et al. |
| 6,409,543 B1 | 6/2002 | Astbury, Jr. et al. |
| 6,414,248 B1 | 7/2002 | Sundstrom |

(56) References Cited

U.S. PATENT DOCUMENTS

| | | |
|---|---|---|
| 6,420,778 B1 | 7/2002 | Sinyansky |
| 6,428,328 B2 | 8/2002 | Haba et al. |
| 6,431,914 B1 | 8/2002 | Billman |
| 6,431,921 B2 | 8/2002 | Saito et al. |
| 6,435,914 B1 | 8/2002 | Billman |
| 6,450,829 B1 | 9/2002 | Weisz-Margulescu |
| 6,457,983 B1 | 10/2002 | Bassler et al. |
| 6,461,183 B1 | 10/2002 | Ohkita et al. |
| 6,461,202 B2 | 10/2002 | Kline |
| 6,464,529 B1 | 10/2002 | Jensen et al. |
| 6,471,523 B1 | 10/2002 | Shuey |
| 6,471,548 B2 | 10/2002 | Bertoncini et al. |
| 6,472,474 B2 | 10/2002 | Burkhardt et al. |
| 6,482,038 B2 | 11/2002 | Olson |
| 6,485,330 B1 | 11/2002 | Doutrich |
| 6,488,549 B1 | 12/2002 | Weller et al. |
| 6,489,567 B2 | 12/2002 | Zachrai |
| 6,491,545 B1 | 12/2002 | Spiegel et al. |
| 6,494,734 B1 | 12/2002 | Shuey |
| 6,503,103 B1 | 1/2003 | Cohen et al. |
| 6,506,076 B2 | 1/2003 | Cohen et al. |
| 6,506,081 B2 | 1/2003 | Blanchfield et al. |
| 6,514,103 B2 | 2/2003 | Pape et al. |
| 6,517,360 B1 | 2/2003 | Cohen |
| 6,520,803 B1 | 2/2003 | Dunn |
| 6,526,519 B1 | 2/2003 | Cuthbert |
| 6,527,587 B1 | 3/2003 | Ortega et al. |
| 6,527,588 B2 | 3/2003 | Paagman |
| 6,528,737 B1 | 3/2003 | Kwong et al. |
| 6,530,134 B1 | 3/2003 | Laphan et al. |
| 6,537,086 B1 | 3/2003 | Mac Mullin |
| 6,537,111 B2 | 3/2003 | Brammer et al. |
| 6,540,522 B2 | 4/2003 | Sipe |
| 6,540,558 B1 | 4/2003 | Paagman |
| 6,540,559 B1 | 4/2003 | Kemmick et al. |
| 6,544,046 B1 | 4/2003 | Hahn et al. |
| 6,544,072 B2 | 4/2003 | Olson |
| 6,547,066 B2 | 4/2003 | Koch |
| 6,551,112 B1 | 4/2003 | Li et al. |
| 6,551,140 B2 | 4/2003 | Billman et al. |
| 6,554,647 B1 | 4/2003 | Cohen et al. |
| 6,565,387 B2 | 5/2003 | Cohen |
| 6,565,388 B1 | 5/2003 | Van Woensel et al. |
| 6,572,409 B2 | 6/2003 | Nitta et al. |
| 6,572,410 B1 | 6/2003 | Volstorf et al. |
| 6,575,774 B2 | 6/2003 | Ling et al. |
| 6,575,776 B1 | 6/2003 | Conner et al. |
| 6,589,071 B1 | 7/2003 | Lias et al. |
| 6,592,381 B2 | 7/2003 | Cohen et al. |
| 6,602,095 B2 | 8/2003 | Astbury, Jr. et al. |
| 6,604,967 B2 | 8/2003 | Middlehurst et al. |
| 6,607,402 B2 | 8/2003 | Cohen et al. |
| 6,623,310 B1 | 9/2003 | Billman et al. |
| 6,629,854 B2 | 10/2003 | Murakami |
| 6,633,490 B2 | 10/2003 | Centola et al. |
| 6,641,410 B2 | 11/2003 | Marvin et al. |
| 6,641,411 B1 | 11/2003 | Stoddard et al. |
| 6,641,825 B2 | 11/2003 | Scholz et al. |
| 6,652,318 B1 | 11/2003 | Winings et al. |
| 6,663,426 B2 | 12/2003 | Hasircoglu et al. |
| 6,665,189 B1 | 12/2003 | Lebo |
| 6,666,693 B2 | 12/2003 | Belopolsky et al. |
| 6,669,514 B2 | 12/2003 | Wiebking et al. |
| 6,672,884 B1 | 1/2004 | Toh et al. |
| 6,672,907 B2 | 1/2004 | Azuma |
| 6,679,709 B2 | 1/2004 | Takeuchi |
| 6,692,272 B2 | 2/2004 | Lemke et al. |
| 6,695,627 B2 | 2/2004 | Ortega et al. |
| 6,702,590 B2 | 3/2004 | Zaderej et al. |
| 6,702,594 B2 | 3/2004 | Lee et al. |
| 6,705,902 B1 | 3/2004 | Yi et al. |
| 6,709,294 B1 | 3/2004 | Cohen et al. |
| 6,712,621 B2 | 3/2004 | Li et al. |
| 6,712,646 B2 | 3/2004 | Shindo |
| 6,716,045 B2 | 4/2004 | Meredith |
| 6,716,068 B2 | 4/2004 | Wu |
| 6,717,825 B2 | 4/2004 | Volstorf |
| 6,726,492 B1 | 4/2004 | Yu |
| 6,736,664 B2 | 5/2004 | Ueda et al. |
| 6,739,910 B1 | 5/2004 | Wu |
| 6,740,820 B2 | 5/2004 | Cheng |
| D492,295 S | 6/2004 | Glatt |
| 6,743,037 B2 | 6/2004 | Kassa et al. |
| 6,743,059 B1 | 6/2004 | Korsunsky et al. |
| 6,746,278 B2 | 6/2004 | Nelson et al. |
| 6,749,439 B1 | 6/2004 | Potter et al. |
| 6,762,067 B1 | 7/2004 | Quinones et al. |
| 6,764,341 B2 | 7/2004 | Lappoehn |
| 6,769,883 B2 | 8/2004 | Brid et al. |
| 6,769,935 B2 | 8/2004 | Stokoe et al. |
| 6,776,635 B2 | 8/2004 | Blanchfield et al. |
| 6,776,649 B2 | 8/2004 | Pape et al. |
| 6,780,027 B2 | 8/2004 | Allison |
| 6,786,771 B2 | 9/2004 | Gailus |
| 6,790,088 B2 | 9/2004 | Ono et al. |
| 6,796,831 B2 | 9/2004 | Yasufuku et al. |
| 6,797,218 B1 | 9/2004 | Bonk et al. |
| D497,343 S | 10/2004 | Busse et al. |
| 6,805,278 B1 | 10/2004 | Olson et al. |
| 6,808,399 B2 | 10/2004 | Rothermel et al. |
| 6,808,420 B2 | 10/2004 | Whiteman, Jr. et al. |
| 6,810,783 B1 | 11/2004 | Larose |
| 6,811,440 B1 | 11/2004 | Rothermel et al. |
| 6,814,590 B2 | 11/2004 | Minich et al. |
| 6,814,619 B1 | 11/2004 | Stokoe et al. |
| 6,824,391 B2 | 11/2004 | Mickievicz et al. |
| 6,829,143 B2 | 12/2004 | Russell et al. |
| 6,835,072 B2 | 12/2004 | Simons et al. |
| 6,835,103 B2 | 12/2004 | Middlehurst et al. |
| 6,843,686 B2 | 1/2005 | Ohnishi et al. |
| 6,843,687 B2 | 1/2005 | McGowan et al. |
| 6,848,886 B2 | 2/2005 | Schmaling et al. |
| 6,848,944 B2 | 2/2005 | Evans |
| 6,848,950 B2 | 2/2005 | Allison et al. |
| 6,848,953 B2 | 2/2005 | Schell et al. |
| 6,851,974 B2 | 2/2005 | Doutrich |
| 6,851,980 B2 | 2/2005 | Nelson et al. |
| 6,852,567 B1 | 2/2005 | Lee et al. |
| D502,919 S | 3/2005 | Studnicky, III |
| 6,866,549 B2 | 3/2005 | Kimura et al. |
| 6,869,292 B2 | 3/2005 | Johnescu et al. |
| 6,869,294 B2 | 3/2005 | Clark et al. |
| 6,872,085 B1 | 3/2005 | Cohen et al. |
| 6,884,117 B2 | 4/2005 | Korsunsky et al. |
| 6,890,184 B2 | 5/2005 | Doblar et al. |
| 6,890,214 B2 | 5/2005 | Brown et al. |
| 6,890,221 B2 | 5/2005 | Wagner |
| 6,893,272 B2 | 5/2005 | Yu |
| 6,893,300 B2 | 5/2005 | Zhou et al. |
| 6,893,686 B2 | 5/2005 | Egan |
| 6,899,566 B2 | 5/2005 | Kline et al. |
| 6,902,411 B2 | 6/2005 | Kubo |
| 6,905,367 B2 | 6/2005 | Crane, Jr. et al. |
| 6,913,490 B2 | 7/2005 | Whiteman, Jr. et al. |
| 6,918,776 B2 | 7/2005 | Spink, Jr. |
| 6,918,789 B2 | 7/2005 | Lang et al. |
| 6,929,504 B2 | 8/2005 | Ling et al. |
| 6,932,649 B1 | 8/2005 | Rothermel et al. |
| 6,939,173 B1 | 9/2005 | Elco et al. |
| 6,945,796 B2 | 9/2005 | Bassler et al. |
| 6,947,012 B2 | 9/2005 | Aisenbrey |
| 6,951,466 B2 | 10/2005 | Sandoval et al. |
| 6,953,351 B2 | 10/2005 | Fromm et al. |
| 6,969,268 B2 | 11/2005 | Brunker et al. |
| 6,969,280 B2 | 11/2005 | Chien et al. |
| 6,975,511 B1 | 12/2005 | Lebo et al. |
| 6,976,886 B2 | 12/2005 | Winings et al. |
| 6,979,202 B2 | 12/2005 | Benham et al. |
| 6,979,215 B2 | 12/2005 | Avery et al. |
| 6,981,883 B2 | 1/2006 | Raistrick et al. |
| 6,988,902 B2 | 1/2006 | Winings et al. |
| 6,994,569 B2 | 2/2006 | Minich et al. |
| 7,001,189 B1 | 2/2006 | McGowan et al. |
| 7,021,975 B2 | 4/2006 | Lappohn |

(56) References Cited

U.S. PATENT DOCUMENTS

| | | |
|---|---|---|
| 7,040,901 B2 | 5/2006 | Benham et al. |
| 7,044,794 B2 | 5/2006 | Consoli et al. |
| 7,059,892 B1 | 6/2006 | Trout |
| 7,059,919 B2 | 6/2006 | Clark et al. |
| 7,065,871 B2 | 6/2006 | Minich et al. |
| 7,070,464 B2 | 7/2006 | Clark et al. |
| 7,074,096 B2 | 7/2006 | Copper et al. |
| 7,086,147 B2 | 8/2006 | Caletka et al. |
| 7,090,501 B1 | 8/2006 | Scherer et al. |
| 7,094,102 B2 | 8/2006 | Cohen et al. |
| 7,097,465 B1 | 8/2006 | Korsunsky et al. |
| 7,097,506 B2 | 8/2006 | Nakada |
| 7,101,191 B2 | 9/2006 | Benham et al. |
| 7,101,228 B2 | 9/2006 | Hammer et al. |
| 7,104,812 B1 | 9/2006 | Bogiel et al. |
| 7,108,556 B2 | 9/2006 | Cohen et al. |
| 7,114,963 B2 | 10/2006 | Shuey et al. |
| 7,114,964 B2 | 10/2006 | Winings et al. |
| 7,118,391 B2 | 10/2006 | Minich et al. |
| RE39,380 E | 11/2006 | Davis |
| 7,131,870 B2 | 11/2006 | Whiteman, Jr. et al. |
| 7,137,848 B1 | 11/2006 | Trout et al. |
| 7,153,162 B2 | 12/2006 | Mizumura et al. |
| 7,160,151 B1 | 1/2007 | Rigby et al. |
| 7,163,421 B1 | 1/2007 | Cohen et al. |
| 7,168,963 B2 | 1/2007 | Minich et al. |
| 7,172,461 B2 | 2/2007 | Davis et al. |
| 7,182,642 B2 | 2/2007 | Ngo et al. |
| 7,182,643 B2 | 2/2007 | Winings et al. |
| D540,258 S | 4/2007 | Peng et al. |
| 7,204,699 B2 | 4/2007 | Stoner et al. |
| 7,207,807 B2 | 4/2007 | Fogg |
| D541,748 S | 5/2007 | Peng et al |
| D542,736 S | 5/2007 | Riku |
| 7,220,141 B2 | 5/2007 | Daily et al. |
| 7,239,526 B1 | 7/2007 | Bibee |
| 7,241,168 B2 | 7/2007 | Sakurai et al. |
| 7,258,562 B2 | 8/2007 | Daily et al. |
| D550,158 S | 9/2007 | Victor |
| D550,628 S | 9/2007 | Whiteman, Jr. et al. |
| 7,267,515 B2 | 9/2007 | Lappohn |
| 7,270,574 B1 | 9/2007 | Ngo |
| 7,273,382 B2 | 9/2007 | Igarashi et al. |
| 7,278,856 B2 | 10/2007 | Minich |
| 7,281,950 B2 | 10/2007 | Belopolsky |
| D554,591 S | 11/2007 | Victor |
| 7,292,055 B2 | 11/2007 | Egitto et al. |
| 7,303,427 B2 | 12/2007 | Swain |
| 7,309,239 B2 | 12/2007 | Shuey et al. |
| 7,316,585 B2 | 1/2008 | Smith et al. |
| 7,322,855 B2 | 1/2008 | Mongold et al. |
| 7,331,802 B2 | 2/2008 | Rothermel et al. |
| 7,335,043 B2 | 2/2008 | Hgo et al. |
| 7,338,321 B2 | 3/2008 | Laurx |
| 7,344,383 B1 | 3/2008 | Lu et al. |
| 7,347,740 B2 | 3/2008 | Minich |
| 7,351,071 B2 | 4/2008 | Korsunsky et al. |
| 7,381,092 B2 | 6/2008 | Nakada |
| 7,384,289 B2 | 6/2008 | Minich |
| 7,384,311 B2 | 6/2008 | Sharf et al. |
| 7,402,064 B2 | 7/2008 | Daily |
| 7,407,387 B2 | 8/2008 | Johnescu |
| 7,422,483 B2 | 9/2008 | Avery et al. |
| 7,425,145 B2 | 9/2008 | Ngo et al. |
| 7,429,176 B2 | 9/2008 | Johnescu |
| 7,445,457 B1 | 11/2008 | Frangioso, Jr. et al. |
| 7,452,242 B2 | 11/2008 | Poh et al. |
| 7,452,249 B2 | 11/2008 | Daily |
| 7,458,839 B2 | 12/2008 | Ngo |
| 7,467,955 B2 | 12/2008 | Raistrick et al. |
| 7,476,108 B2 | 1/2009 | Swain |
| 7,497,735 B2 | 3/2009 | Belopolsky |
| 7,497,736 B2 | 3/2009 | Minich et al. |
| 7,500,871 B2 | 3/2009 | Minich et al. |
| 7,503,804 B2 | 3/2009 | Minich |
| 7,541,135 B2 | 6/2009 | Swain |
| 7,549,897 B2 | 6/2009 | Fedder et al. |
| 7,553,182 B2 | 6/2009 | Buck et al. |
| 7,588,463 B2 | 9/2009 | Yamada et al. |
| 7,621,781 B2 | 11/2009 | Rothermel et al. |
| D607,822 S | 1/2010 | Dennes |
| D611,908 S | 3/2010 | Takada et al. |
| 7,708,569 B2 | 5/2010 | Sercu et al. |
| D618,180 S | 6/2010 | Gross et al. |
| D618,181 S | 6/2010 | Gross et al. |
| 7,753,731 B2 | 7/2010 | Cohen et al. |
| 7,762,843 B2 | 7/2010 | Minich et al. |
| D626,075 S | 10/2010 | Truskett et al. |
| 7,833,065 B2 * | 11/2010 | Lin et al. ............ 439/639 |
| D628,963 S | 12/2010 | Sau et al. |
| 7,883,366 B2 | 2/2011 | Davis et al. |
| 7,976,326 B2 | 7/2011 | Stoner |
| 7,988,456 B2 | 8/2011 | Davis et al. |
| 8,011,957 B2 | 9/2011 | Pan |
| D651,177 S | 12/2011 | Luo |
| 8,079,847 B2 | 12/2011 | Davis et al. |
| D653,621 S | 2/2012 | Gross et al. |
| 8,109,770 B2 | 2/2012 | Perugini et al. |
| 8,157,599 B2 * | 4/2012 | Wei ..................... 439/660 |
| 8,231,415 B2 | 7/2012 | Johnescu et al. |
| 8,277,241 B2 | 10/2012 | Horchler et al. |
| 8,366,485 B2 | 2/2013 | Johnescu |
| 8,374,470 B2 | 2/2013 | Ban et al. |
| 8,408,939 B2 | 4/2013 | Davis et al. |
| 8,414,199 B2 | 4/2013 | Ishigami |
| 8,465,213 B2 | 6/2013 | Tamura et al. |
| 8,480,413 B2 | 7/2013 | Minich et al. |
| RE44,556 E | 10/2013 | Minich |
| 8,632,263 B2 | 1/2014 | Nekado et al. |
| 2001/0003685 A1 | 6/2001 | Aritani |
| 2001/0008189 A1 | 7/2001 | Reede |
| 2001/0012729 A1 | 8/2001 | Van Woensel |
| 2001/0041477 A1 | 11/2001 | Billman et al. |
| 2001/0046810 A1 | 11/2001 | Cohen et al. |
| 2001/0046816 A1 | 11/2001 | Saito et al. |
| 2002/0013101 A1 | 1/2002 | Long |
| 2002/0039857 A1 | 4/2002 | Naito et al. |
| 2002/0084105 A1 | 7/2002 | Geng et al. |
| 2002/0098727 A1 | 7/2002 | McNamara et al. |
| 2002/0106930 A1 | 8/2002 | Pape et al. |
| 2002/0106932 A1 | 8/2002 | Holland et al. |
| 2002/0111068 A1 | 8/2002 | Cohen et al. |
| 2002/0127903 A1 | 9/2002 | Billman et al. |
| 2002/0142629 A1 | 10/2002 | Zaderej et al. |
| 2002/0142676 A1 | 10/2002 | Hosaka et al. |
| 2002/0159235 A1 | 10/2002 | Miller et al. |
| 2002/0173177 A1 | 11/2002 | Korsunsky et al. |
| 2005/0170700 A1 | 8/2005 | Shuey et al. |
| 2005/0196987 A1 | 9/2005 | Shuey et al. |
| 2005/0202722 A1 | 9/2005 | Regnier et al. |
| 2005/0215121 A1 | 9/2005 | Tokunaga |
| 2005/0227552 A1 | 10/2005 | Yamashita et al. |
| 2005/0277315 A1 | 12/2005 | Mongold et al. |
| 2005/0287869 A1 | 12/2005 | Kenny et al. |
| 2006/0003620 A1 | 1/2006 | Daily et al. |
| 2006/0014433 A1 | 1/2006 | Consoli et al. |
| 2006/0024983 A1 | 2/2006 | Cohen et al. |
| 2006/0024984 A1 | 2/2006 | Cohen et al. |
| 2006/0046526 A1 | 3/2006 | Minich |
| 2006/0051987 A1 | 3/2006 | Goodman et al. |
| 2006/0068610 A1 | 3/2006 | Belopolsky |
| 2006/0068641 A1 | 3/2006 | Hull et al. |
| 2006/0073709 A1 | 4/2006 | Reid |
| 2006/0116857 A1 | 6/2006 | Sevic et al. |
| 2006/0121749 A1 | 6/2006 | Fogg |
| 2006/0128197 A1 | 6/2006 | McGowan et al. |
| 2006/0141818 A1 | 6/2006 | Ngo |
| 2006/0183377 A1 | 8/2006 | Sinsheimer |
| 2006/0192274 A1 | 8/2006 | Lee et al. |
| 2006/0216969 A1 | 9/2006 | Bright et al. |
| 2006/0228912 A1 | 10/2006 | Morlion et al. |
| 2006/0232301 A1 | 10/2006 | Morlion et al. |
| 2006/0281354 A1 | 12/2006 | Ngo et al. |
| 2007/0004287 A1 | 1/2007 | Marshall |

(56) References Cited

U.S. PATENT DOCUMENTS

| | | |
|---|---|---|
| 2007/0021002 A1 | 1/2007 | Laurx et al. |
| 2007/0042639 A1 | 2/2007 | Manter et al. |
| 2007/0071391 A1 | 3/2007 | Mazotti et al. |
| 2007/0099455 A1 | 5/2007 | Rothermel et al. |
| 2007/0099512 A1 | 5/2007 | Sato |
| 2007/0183707 A1 | 8/2007 | Umezawa |
| 2007/0183724 A1 | 8/2007 | Sato |
| 2007/0202715 A1 | 8/2007 | Daily et al. |
| 2007/0202747 A1 | 8/2007 | Sharf et al. |
| 2007/0205774 A1 | 9/2007 | Minich |
| 2007/0207641 A1 | 9/2007 | Minich |
| 2007/0293084 A1 | 12/2007 | Ngo |
| 2008/0032524 A1 | 2/2008 | Lemke et al. |
| 2008/0045079 A1 | 2/2008 | Minich et al. |
| 2008/0176453 A1 | 7/2008 | Minich et al. |
| 2008/0232737 A1 | 9/2008 | Ishigami et al. |
| 2008/0246555 A1 | 10/2008 | Kirk et al. |
| 2008/0248670 A1 | 10/2008 | Daily et al. |
| 2008/0316729 A1 | 12/2008 | Rothermel et al. |
| 2009/0011643 A1 | 1/2009 | Amleshi et al. |
| 2010/0055983 A1 | 3/2010 | Wu |
| 2010/0093209 A1 | 4/2010 | Liu et al. |
| 2010/0216342 A1 | 8/2010 | Lin |
| 2010/0240233 A1 | 9/2010 | Johnescu et al. |
| 2010/0291803 A1 | 11/2010 | Kirk |
| 2011/0159744 A1 | 6/2011 | Buck |
| 2011/0195593 A1 | 8/2011 | McGrath et al. |
| 2012/0214343 A1 | 8/2012 | Buck et al. |
| 2012/0289095 A1 | 11/2012 | Kirk |
| 2013/0005160 A1 | 1/2013 | Minich |
| 2013/0122744 A1 | 5/2013 | Morgan et al. |
| 2013/0149881 A1 | 6/2013 | Johnescu et al. |
| 2013/0149890 A1 | 6/2013 | Schroll et al. |
| 2013/0195408 A1 | 8/2013 | Hermeline et al. |
| 2013/0210246 A1 | 8/2013 | Davis et al. |
| 2013/0273781 A1 | 10/2013 | Buck et al. |
| 2014/0017957 A1 | 1/2014 | Horchler et al. |

FOREIGN PATENT DOCUMENTS

| | | |
|---|---|---|
| DE | 3605316 | 8/1987 |
| DE | 4040551 | 4/1993 |
| DE | 10226279 | 11/2003 |
| DE | 102010005001 | 8/2010 |
| EP | 0212764 | 3/1987 |
| EP | 0273683 | 7/1988 |
| EP | 0337634 | 10/1989 |
| EP | 0442785 | 8/1991 |
| EP | 0486298 | 5/1992 |
| EP | 0321257 | 4/1993 |
| EP | 0560550 | 9/1993 |
| EP | 0562691 | 9/1993 |
| EP | 0591772 | 4/1994 |
| EP | 0623248 | 11/1995 |
| EP | 0706240 | 4/1996 |
| EP | 0782220 | 7/1997 |
| EP | 0789422 | 8/1997 |
| EP | 0843383 | 5/1998 |
| EP | 0635910 | 6/2000 |
| EP | 1024556 | 8/2000 |
| EP | 1111730 | 6/2001 |
| EP | 0891016 | 10/2002 |
| EP | 1091449 | 9/2004 |
| EP | 1148587 | 4/2005 |
| GB | 1162705 | 8/1969 |
| JP | 57/058115 | 4/1982 |
| JP | 60/072663 | 4/1985 |
| JP | 02/278893 | 11/1990 |
| JP | 0521119 | 1/1993 |
| JP | 05344728 | 12/1993 |
| JP | 0668943 | 3/1994 |
| JP | 06236788 | 8/1994 |
| JP | 07114958 | 5/1995 |
| JP | 07169523 | 7/1995 |
| JP | 0896918 | 4/1996 |
| JP | 08125379 | 5/1996 |
| JP | 09199215 | 7/1997 |
| JP | 11185886 | 7/1999 |
| JP | 2000/003743 | 1/2000 |
| JP | 2000/003744 | 1/2000 |
| JP | 2000/003745 | 1/2000 |
| JP | 2000/003746 | 1/2000 |
| JP | 2000/228243 | 8/2000 |
| JP | 2001/135388 | 5/2001 |
| JP | 2001/305182 | 10/2001 |
| JP | 2002/008790 | 1/2002 |
| JP | 2003/217785 | 7/2003 |
| JP | 2007/128706 | 5/2007 |
| KR | 100517561 | 9/2005 |
| TW | 576555 | 8/1990 |
| TW | 546872 | 8/2003 |
| WO | WO 90/16093 | 12/1990 |
| WO | WO 96/38889 | 12/1996 |
| WO | WO 96/42123 | 12/1996 |
| WO | WO 97/20454 | 6/1997 |
| WO | WO 97/43885 | 11/1997 |
| WO | WO 97/44859 | 11/1997 |
| WO | WO 97/45896 | 12/1997 |
| WO | WO 98/15989 | 4/1998 |
| WO | WO 00/16445 | 3/2000 |
| WO | WO 01/29931 | 4/2001 |
| WO | WO 01/39332 | 5/2001 |
| WO | WO 02/058191 | 7/2002 |
| WO | WO 02/101882 | 12/2002 |
| WO | WO 02/103847 | 12/2002 |
| WO | WO 2005/065254 | 7/2005 |
| WO | WO 2006/031296 | 3/2006 |
| WO | WO 2006/105535 | 10/2006 |
| WO | WO 2007/064632 | 6/2007 |
| WO | WO 2008/082548 | 7/2008 |
| WO | WO 2008/117180 | 10/2008 |
| WO | WO 2012/047619 | 4/2012 |
| WO | WO 2012/174120 | 12/2012 |

OTHER PUBLICATIONS

IBM Technical Disclosure Bulletin, 1972, 14(8), 2 pages.
IBM Technical Disclosure Bulletin, 1977, 20(2), 2 pages.
IBM Technical Disclosure Bulletin, 1990, 32(11), 2 pages.
Kazmierowicz, "Profiling Your Solder Reflow Oven in Three Passes or Less", KIC Oven Profiling, Surface Mount Technology, 1990, 2 pages.
Kazmierowicz, "The Science Behind Conveyor Oven Thermal Profiling", KIC Oven Profiling, Surface Mount Technology,1990, 9 pages.
"Micro Electronic Interconnects", Alphametals, 1990, 4 pages.
Research Disclosure, Kenneth Mason Publications Ltd., England, Aug. 1990, No. 316, 1 page.
Research Disclosure, Kenneth Mason Publications Ltd., England, Oct. 1992, No. 342, 1 page.
Siemens, "SpeedPac: A New Concept for the Next Generation of Transmission Speed," Backplane Interconnection, Issue 1/96.
U.S. Appl. No. 29/449,794, filed Mar. 15, 2013, Zerebilov et al.
U.S. Appl. No. 29/418,299, filed Apr. 13, 2012, Buck et al.
U.S. Appl. No. 29/418,310, filed Apr. 13, 2012, Buck et al.
U.S. Appl. No. 29/418,313, filed Apr. 13, 2012, Zerebilov et al.
U.S. Appl. No. 29/426,921, filed Jul. 11, 2012, Horchler.
U.S. Appl. No. 29/444,125, filed Jan. 25, 2013, Harper Jr. et al.
"1.0 HDMI Right Angle Header Assembly (19 Pin) Lead Free", Molex Incorporated, Jul. 20, 2004, 7 pages.
"1.90 by 1.35mm (.075 by.053) Pitch Impact, Backplane Connector System 3 and 4 Pair, Features and Specification", Molex, www.molex.com/link/Impact.html, 2008, 5 pages.
"4.0 UHD Connector Differential Signal Crosstalk, Reflections", 1998, p. 8-9.
Ahn et al., "A Design of the Low-Pass Filter Using the Novel Microstrip Defected Ground Structure", IEEE Transactions on Microwave Theory and Techniques, 2001, 49(1), 86-93.
"AMP Z-Dok and Z-Dok and Connectors", Tyco Electronics/AMP, Application Specification #114-13068, Aug. 30, 2005, 17 pages.

(56) References Cited

OTHER PUBLICATIONS

"AMP Z-Pack 2mm HM Connector, 2mm Centerline, Eight-Row, Right-Angle Applications", Electrical Performance Report, EPR 889065, Issued Sep. 1998, 59 pages.
"AMP Z-Pack 2mm HM Interconnection System", 1992/1994, AMP Incorporated, 6 pages.
"AMP Z-Pack HM-Zd Performance at Gigabit Speeds", Tyco Electronics, Report #20GC014, Rev.B., May 4, 2001, 32 pages.
"B.? Bandwidth and Rise Time Budgets, Module 1-8 Fiber Optic Telecommunications (E-XVI-2a)", http:—cord.org-step_online-st1-8-st18exvi2a.htm, 2006, 1-3.
"Backplane Connectors", http://www.amphenol-tcs.com/products/connectors/backplane/index.html, Amphenol TCS (ATCS), Jun. 19, 2008, 1-3.
"Champ Z-Dok Connector System", Tyco Electronics, Jan. 2002, 3 pages.
Chen et al., "Characteristics of Coplanar Transmission Lines on Multilayer Substrates: Modeling and Experiments", IEEE Transactions on Microwave Theory and Techniques, Jun. 1997, 45(6), 939-945.
Cheng et al., "Terahertz-Bandwidth Characteristics of Coplanar Transmission Lines on Low Permittivity Substrates", IEEE Transactions on Microwave Theory and Techniques, 1994, 42(12), 2399-2406.
Chua et al., "Broadband Characterisation of CPW Transition and Transmission Line Parameters for Small Reflection Up to 100 GHZ", RF and Microwave Conference, 2004, 269-271.
"Daughtercard Hole Pattern: Signal Modules (10 & 25 positions) Connector Assembly", Customer No. C-163-5101-500, Teradyne Connection Systems, Inc., 2001, 1 page.
Derman "Speed, Density Push Design Xomplexities," Electronic Engineering Times, May 1998, 2 pages.
European Patent Application No. 12305119.5: European Search Report dated Jul. 11, 2012, 5 pages.
European Patent Application No. 10753953.8: Extended European Search Report dated Nov. 7, 2013, 6 pages.
"FCI's Airmax VS Connector System Honored at DesignCon 2005", http:—www.heilind.com-products-fci-airmax-vs-design.asp, Heilind Electronics, Inc., 2005, 1 page.
Finan, "Thermally Conductive Thermoplastics", LNP Engineering Plastics, Inc., Plastics Engineering 2000, www.4spe.org, 4 pages.
"Framatome Connector Specification", May 10, 1999, 1 page.
Fusi et al., "Differential Signal Transmission through Backplanes and Connectors", Electronic Packaging and Production, Mar. 1996, 27-31.
"GbXI-Trac Backplane Connector System", www.molex.com/cgi-bin, Molex, 2007, 1-3.
"Gig-Array Connector System, Board to Board Connectors", 2005, 4 pages.
"Gig-Array High Speed Mezzanine Connectors 15-40 mm Board to Board", FCI Corporation, Jun. 5, 2006, 1 page.
Goel et al., "AMP Z-Pack Interconnect System", AMP Incorporated, 1990, 9 pages.
"HDM Separable Interface Detail", Molex, Feb. 17, 1993, 3 pages.
"HDM Stacker Signal Integrity", http://www.teradyne.com/prods/tcs/products/connectors/mezzanine/hdm_stacker/signintegrity.html, Amphenol TCS (ATCS), Feb. 2, 2006, 3 pages.
"HDM, HDM Plus Connectors", http:—www.teradyne.com-prods-tcs-products-connectors-backplane-hdm-index.html, Amphenol TCS, 2006, 1 page.
"HDM/HDM Plus, 2mm, Backplane Interconnection System", Teradyne Connection Systems, 1993, 22 pages.
Hettak et al., "Simultaneous Realization of Millimeter Wave Uniplanar Shunt Stubs and DC Block", IEEE MTT-S Digest, 1998, 809-812.
"High Definition Multimedia Interface (HDMI)", www.molex.corn, Molex, Jun. 19, 2008, 2 pages.
"High Speed Backplane Interconnect Solutions", Tyco Electronics, 2007, 6 pages.

"High Speed Characterization Report, SEAM-30-02.0-S-10-2", www.samtec.com, SAMTEC, 2005, 55 pages.
"Honda High-Speed Backplane Connector NSP Series", Honda Connectors, Feb. 7, 2003, 25 pages.
Hult, "FCI's Problem Solving Approach Changes Market, The FCI Electronics AirMax VS", http:—www.connecotrsupplier.com-tech_updates_FCI-Airmax_archive.htm, ConnectorSupplier.com, 2006, 1-4.
Hunsaker, "Ventura Application Design", TB-2127, Amphenol, Aug. 25, 2005, 13 pages.
"Impact 3 Pair 10 col. Signal Module", Tyco Electronics, Mar. 25, 2008, 1 page.
"Impact 3 Pair Header Unguided Open Assembly", Tyco Electronics, Apr. 11, 2008, 1 page.
"Impact Connector Offered by Tyco Electronic, High Speed Backplane Connector System", Tyco Electronics, Apr. 15, 2008, 12 pages.
International Application No. PCT/U82003/014370, International Search Report dated Aug. 6, 2003, 2 pages.
International Application No. PCT/US2010/040899, International Search Report dated Jan. 25, 2011, 2 pages.
International Patent Application No. PCT/U82013/035775: International Search Report dated Jul. 18, 2013, 3 pages.
International Patent Application No. PCT/US2013/035915: International Search Report and Written Opinion dated Jul. 25, 2013, 17 pages.
International Patent Application No. PCT/US2013/049995: International Search Report dated Oct. 28, 2013, 18 pages.
Lee et al., "Characteristic of the Coplanar Waveguide to Microstrip Right-Angled Transition", Department of Electronics Engineering, 1998, 3 pages.
Leung et al., "Low-Loss Coplanar Waveguides Interconnects on Low-Resistivity Silicon Substrate", IEEE Transactions on Components and Packaging Technologies, 2004, 27(3), 507-512.
Lim et al., "A Spiral-Shaped Defected Ground Structure for Coplanar Waveguide", IEEE Microwave and Wireless Components Letters, 2002, 12(9), 330-332.
"Lucent Technologies' Bell Labs and FCI Demonstrate 25gb-S Data Transmission Over Electrical Backplane Connectors", http:—www.lucent.com-press-0205-050201.bla.html, Lucent Tech Bell Labs, Feb. 1, 2005,1-4.
Machac et al., "Space Leakage of Power from Uniplanar Transmission Lines", Czech Technical University, 565-568.
Mao et al., "Characterization of Coplanar Waveguide Open End Capacitance-Theory and Experiment", IEEE Transactions on Microwave Theory and Techniques, 1994, 42(6), 1016-1024.
"Metrel 1000 Series, 5 Row Receptacle, Right Angle, Press Fit, PCB Mounted Receptacle Assembly", FCI 2001, 1 page.
"Metrel 2mm High-Speed Connectors, 1000, 2000, 3000 Series, Electrical Performance Data for Differential Applications", FCI Framatome Group, 2000, 2 pages.
"Metrel Speed & Density Extensions", FCI, Jun. 3, 1999, 1-25.
"Mezzanine High Speed High-Density Connectors Gig-Array and Meg-Array Electrical Performance Data", FCI Corporation, 10 pages.
"Millipacs Connector, Type A Specification", Dec. 14, 2004,1 page.
Mottonen et al., "Novel Wide-Band Coplanar Waveguide-to-Rectangular Waveguide Transition", IEEE Transactions on Microwave Theory and Techniques, 2004, 52(8), 1836-1842.
Nadolny et al., "Optimizing Connector Selection for Gigabit Signal Speeds", http:—www.ecnmag.com-article-CA45245, ECN, Sep. 1, 2000, 6 pages.
"NSP Series, Backplane High-Speed Data Transmission Cable Connectors", http:—www.honda-connectors.co.jp, Honda Connectors, 2006, 6 pages, English Translation attached.
Ogando, "And now—An Injection-Molded Heat Exchanger", Sure, plastics are thermal insulators, but additive packages allow them to conduct heat instead, Global Design News, Nov. 1, 2000, 4 pages.
"Open Pin Field Array Seaf Series", www.samtec.com, SAMTEC, 2005, 1 page.
"Overview for High Density Backplane Connector (Z-Pack Tin-Man)", Tyco Electronics, 2008, 1 page.

(56) References Cited

OTHER PUBLICATIONS

"Overview for High Density Backplane Connectors (Impact) Offered by Tyco Elecctronics", www.tycoelectronics.com/catalog, Tyco Electronics, 2007, 1-2.
"Overview: Backplane Products", http:—www.molex.com-cgi-bin-bv-molex-super_family-super_family.jsp?BV_SessionID=@, Molex, Feb. 8, 2006, 4 pages.
"PCB-Mounted Receptacle Assemblies, 2.00 mm (0.079 In) Centerlines, Right-Angle Solder-to-Board Signal Receptacle", Metrel, Berg Electronics, 2 pages.
Power TwinBlade I/O Cable Connector RA-North-South, No. GS-20_072, Aug. 6, 2007, 11 pages.
"Product Datasheets, 10 Bgit/s XENPAK 850 nm Transponder (TRP10GVP2045)", MergeOptics GmbH, 2005, 13 pages.
"Product Datasheets, Welcome to XENPAK.org.", http://www.xenpak.org., 2001, 1 page.
Sherman, "Plastics that Conduct Heat", Plastics Technology Online, Jun. 2001, http://www.plasticstechnology.com, 4 pages.
Soliman. et al., "Multimodel Characterization ofPlanar Microwave Structures", IEEE Transactions on Microwave Theory and Techniques, 2004, 52(1), 175-182.
Son et al., "'Picosecond Pulse Propagation on Coplanar Striplines Fabricated on Lossy Semiconductor Substrates: Modeling and Experiments", IEEE Transactions on Microwave Theory and Techniques, 1993, 41(9), 1574-1580.
Straus, "Shielded In-Line Electrical Multiconnector", IBM Technical Disclosure Bulletin, Aug. 3, 1967, 10(3), 3 pages.
Suh et al., "Coplanar Strip line Resonators Modeling and Applications to Filters", IEEE Transactions on Microwave Theory and Techniques, 2002, 50(5), 1289-1296.
"Two-Piece, High-Speed Connectors", www.tycoelectronics.com/catalog, Tyco Electronics, 2007, 1-3.
"Tyco Unveils Z-Pack TinMan Orthogonal Connector System", http://www.epn-online.com/page/new59327/tyco-unveils-z-pack-orthogonal-conn, Oct. 13, 2009, 4 pages.
Tzuang et al., "Leaky Mode Perspective on Printed Antenna", Proc. Natl. Sci. Counc. ROC(A), 1999, 23(4), 544-549.
"Ventura High Performance, Highest Density Available", http://www.amphenol-tcs.com/products/connectors/backplane/ventura/index.html, Amphenol TCS (ATCS), Jun. 19, 2008, 1-2.
"VHDM Connector", http://www.teradyne.com/prods/tcs/products/connectors/backplane/vhdm/index.html, Amphenol TCS (ATCS), Jan. 31, 2006, 2 pages.
"VHDM Daughterboard Connectors Feature Press-Fit Terminations and a Non-Stubbing Separable Interface", Teradyne, Inc. Connections Sys Div, Oct. 8, 1997, 46 pages.
"VHDM High-Speed Differential (VHDM HSD)", http://www.teradyne.com/prods/bps/vhdm/hsd.html, Teradyne, Jan. 24, 2000, 6 pages.
"VHDM L-Series Connector", http://www.teradyne.com/prods/tcs/products/connectors/backplane/vhdm_1-series/index.html, Amphenol TCS(ATCS), 2006, 4 pages.
Weller et al., "High Performance Microshield Line Components", IEEE Transactions on Microwave Theory and Techniques, 1995, 43(3), 534-543.
Williams et al., "Accurate Transmission Line Characterization", IEEE Microwave and Guided Wave Letters, 1993, 3(8), 247-249.
Wu et al., "Full-Wave Characterization of the Mode Conversion in a Coplanar Waveguide Right-Angled Bend", IEEE Transactions on Microwave Theory and Techniques, 1995, 43(11), 2532-2538.
"XCede® Connector", http://www.amphenol-tcs.com/products/connectors/backplane/xcede/index,html, Amphenol TCS (ATCS), Jun. 19, 2008, 1-5.
Ya et al., "Microstrip and Slotline Two-Pole Microwave Filters with Additional Transmission Zeros", Int. Crimean Conference, Microwave & Telecommunication Technology, 2004, 405-407 (English Abstract provided).
"Z-Dok and Connector", http://2dok.tyco.electronics.com, Tyco Electronics, May 23, 2003, 1-15.
"Z-Pack Slim UHD", http:/www.zpackuhd.com, Tyco Electronics, 2007, 8 pages.
"Z-Pack TinMan High Speed Orthogonal Connector Product Feature Selector", Tyco Electronics, 2009, 2 pages.
"Z-Pack TinMan Product Portfolio Expanded to Include 6-Pair Module", Tyco Electronics, Jun. 19, 2008, 1 page.

* cited by examiner

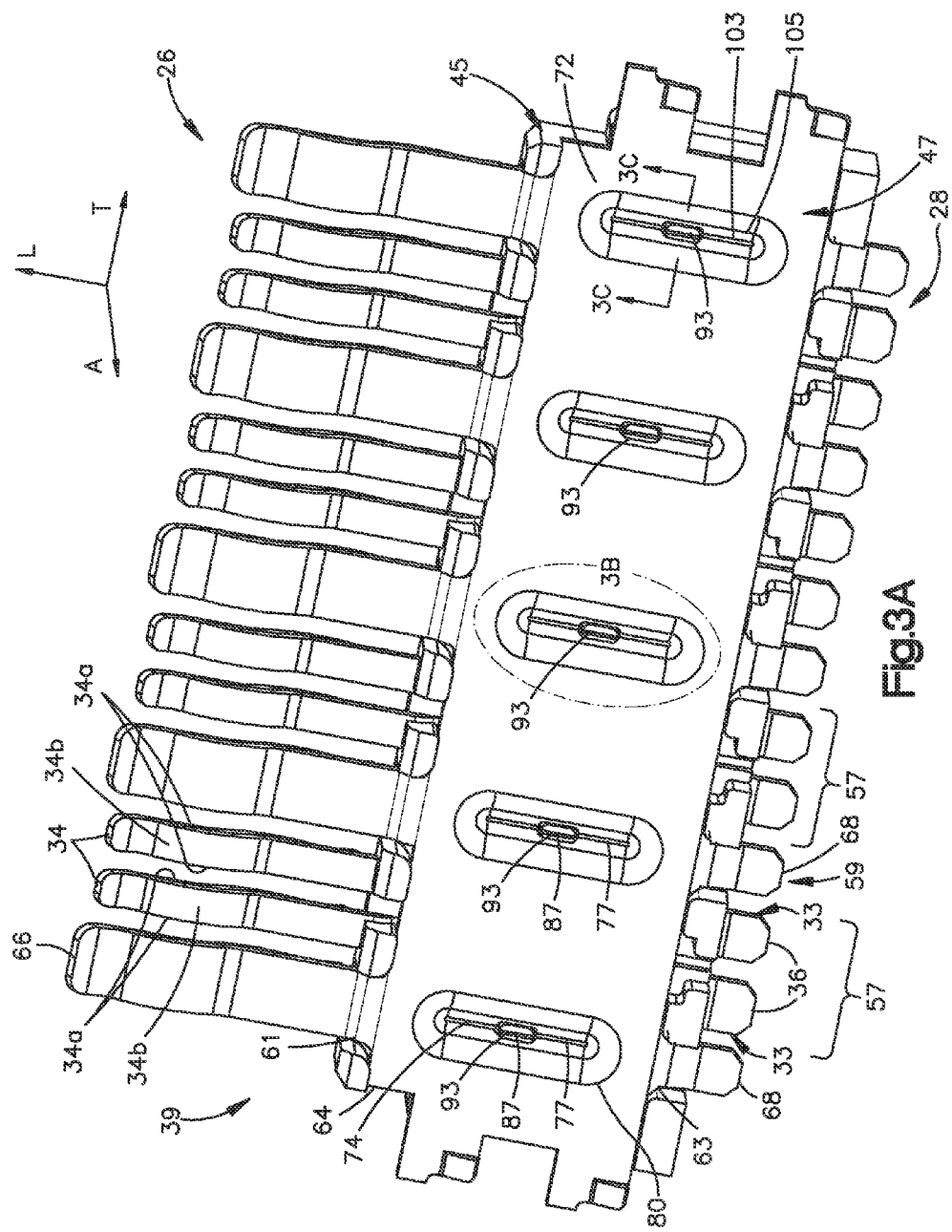

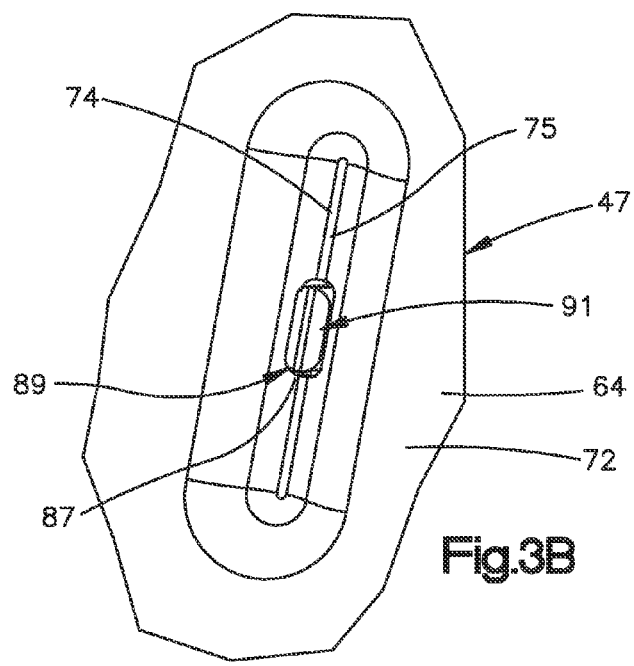
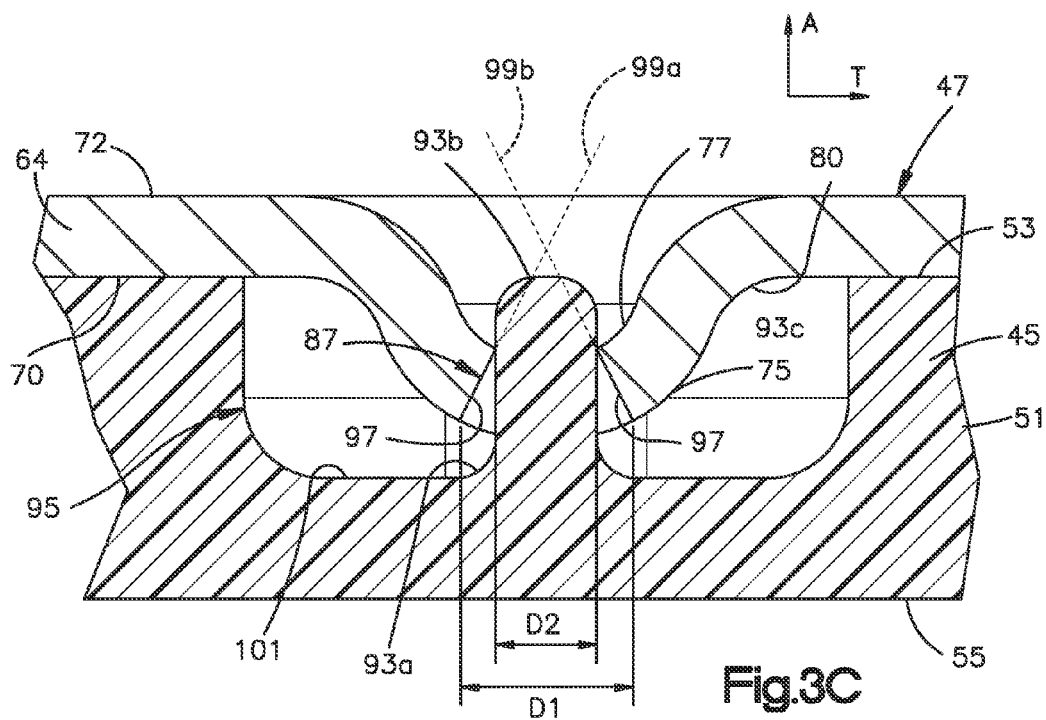

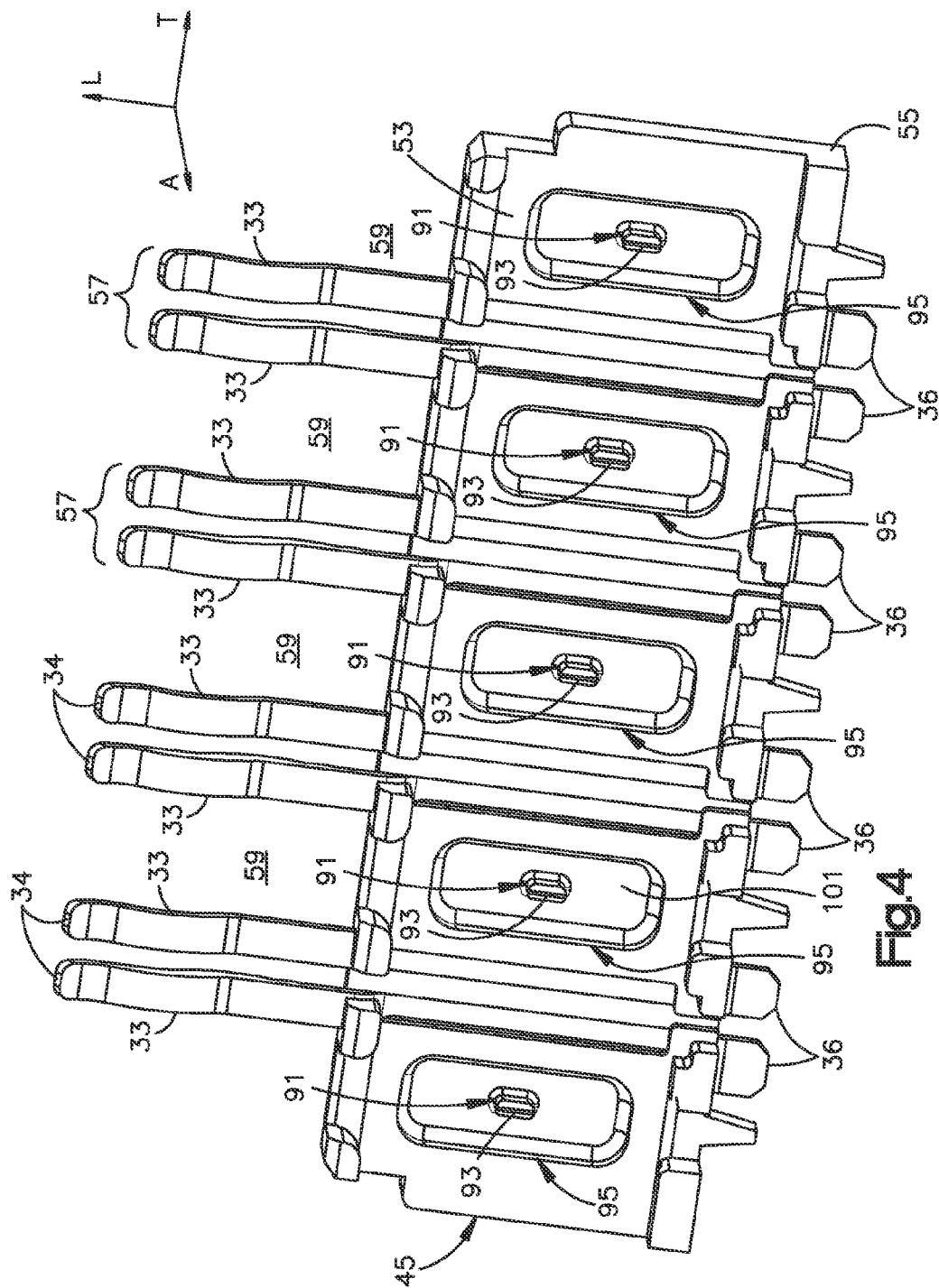

ELECTRICAL CONNECTOR HAVING RIBBED GROUND PLATE WITH ENGAGEMENT MEMBERS

CROSS-REFERENCE TO RELATED APPLICATIONS

This claims the benefit of U.S. Provisional Patent Application Ser. No. 61/624,238 filed Apr. 13, 2012, the disclosure of which is hereby incorporated by reference as if set forth in its entirety herein. This is related to U.S. patent application Ser. No. 12/722,797 filed Mar. 12, 2010 and U.S. patent application Ser. No. 12/828,824, filed Jul. 1, 2010, the disclosure of each of which is hereby incorporated by reference as if set forth in its entirety herein. This is also related to U.S. patent application Ser. No. 13/755,628 filed Jan. 13, 2013.

BACKGROUND

Electrical connectors provide signal connections between electronic devices using electrically-conductive contacts. It is sometimes desirable to increase data transfer through an existing connector without changing the physical dimensions (height, width, depth, mating interface, and mounting interface) of the connector. However, it is difficult to change one aspect of an electrical connector without unintentionally changing another aspect. For example, metallic crosstalk shields can be added to an electrical connector to reduce crosstalk, but the addition of shields generally lowers the impedance. At lower data transmission speeds, such at 1 to 1.25 Gigabits/sec, impedance matching does not substantially affect performance. However, as data transmission speeds increase to 10 Gigabits/sec through 40 Gigabits/sec and any discrete point therebetween, skew and impedance mismatches become problematic. Therefore, while crosstalk can be lowered by adding a metallic crosstalk shield to an existing electrical connector, other problems with signal integrity can be created.

U.S. patent application Ser. No. 12/722,797 and U.S. patent application Ser. No. 12/828,824, the disclosure of each of which is hereby incorporated by reference as if set forth in its entirety herein, describe embossed ground plates that can be included in an electrical connector to provide crosstalk-reducing shields in accordance with certain embodiments. The embossed ground plates can define ground mating ends and ground mounting ends that replace discrete overmolded ground contacts associated with conventional leadframe assemblies. The embossed ground plates can be included in right angle electrical connectors and/or a vertical electrical connector.

SUMMARY

In accordance with one aspect of the present disclosure, an electrical connector includes a dielectric housing and a plurality of electrical signal contacts supported by the dielectric housing. The dielectric housing can include a housing body that defines a first housing surface and a second housing surface opposite the first surface. The housing body defines at least one protrusion extending out from the first surface. The electrical connector can further include a ground plate that, in turn, includes a ground plate body that defines a first plate body surface configured to face the first housing surface when the ground plate is attached to the dielectric housing, and a second plate body surface opposite the first plate body surface. The ground plate including at least one rib that defines first and second opposed rib surfaces. The first rib surface can project from the first plate body surface and the second rib surface can be recessed into the second plate body surface. The ground plate defines at least one aperture extending through the rib. The aperture defines a first dimension along a select direction at the front surface of the ground plate body and a second dimension along the select direction at the second surface of the ground plate body, such that the first dimension is greater than the second dimension.

BRIEF DESCRIPTION OF THE DRAWINGS

The foregoing summary, as well as the following detailed description of a preferred embodiment of the application, will be better understood when read in conjunction with the appended drawings. For the purposes of illustrating the flexible anchoring keel and related instruments of the present application, there is shown in the drawings a preferred embodiment. It should be understood, however, that the application is not limited to the precise arrangements and instrumentalities shown. In the drawings:

FIG. 3A is a perspective view of a leadframe assembly of the vertical header connector illustrated in FIG. 1, the leadframe assembly including a leadframe housing, a plurality of electrical contacts supported by the leadframe housing, and an embossed ground plate attached to the leadframe housing;

FIG. 3B is an enlarged portion of the perspective view of the leadframe assembly illustrated in FIG. 3A, taken at region 3B, showing the ground plate defining a first retention member configured as an aperture, and the leadframe housing including a second retention member configured as a protrusion that is attached to the ground plate in the aperture;

FIG. 3C is a sectional side elevation view of the enlarged portion illustrated in FIG. 3B, taken along line 3C-3C;

FIG. 4 is a perspective view of the leadframe housing and electrical contacts that are supported by the leadframe housing as illustrated in FIG. 3A;

DETAILED DESCRIPTION

Figure 1:
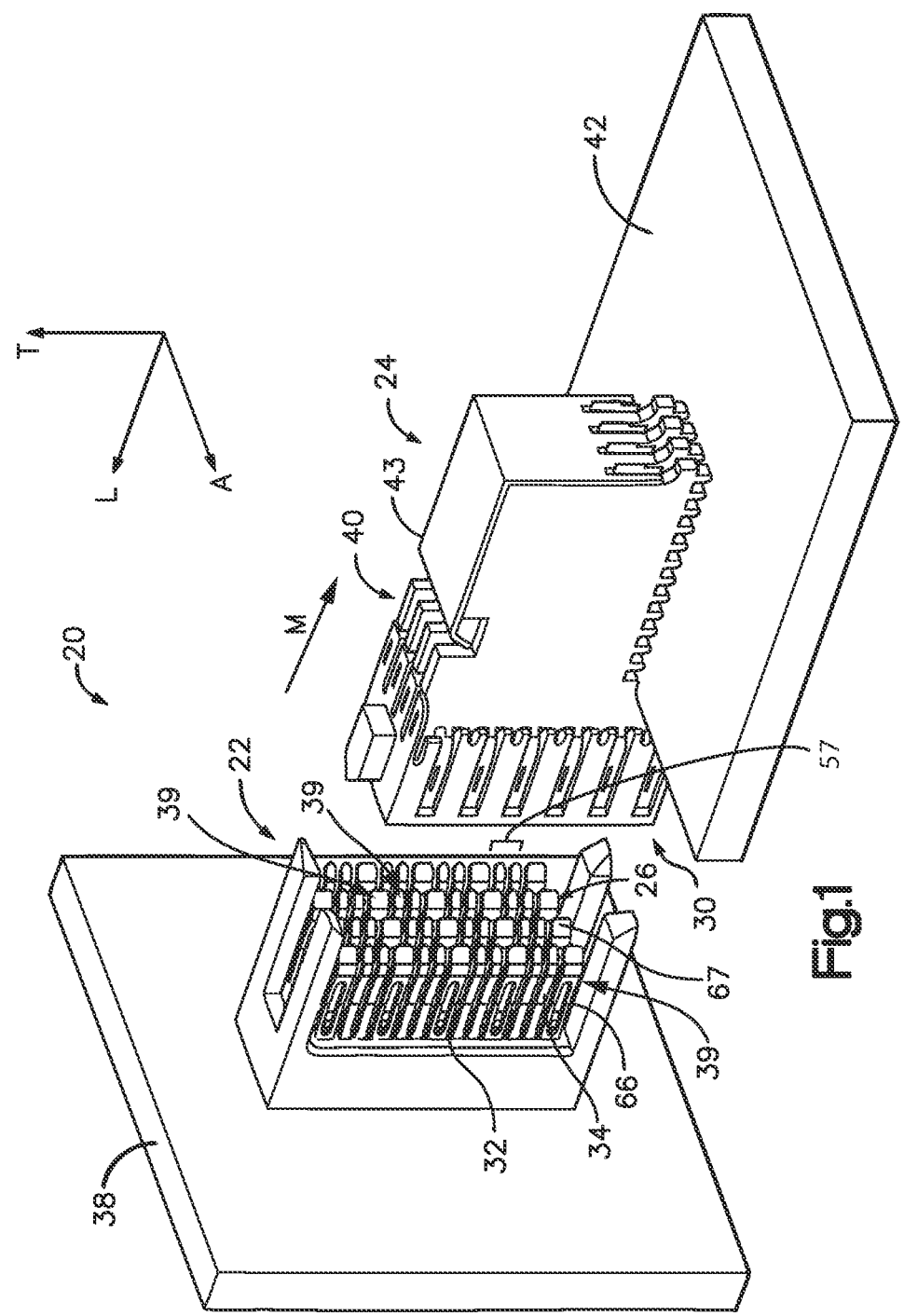
FIG. 1 is a perspective view of an electrical connector assembly including a vertical header connector and a right-angle receptacle connector mounted onto respective substrates, and configured to be mated with each other.
Figure 2A:
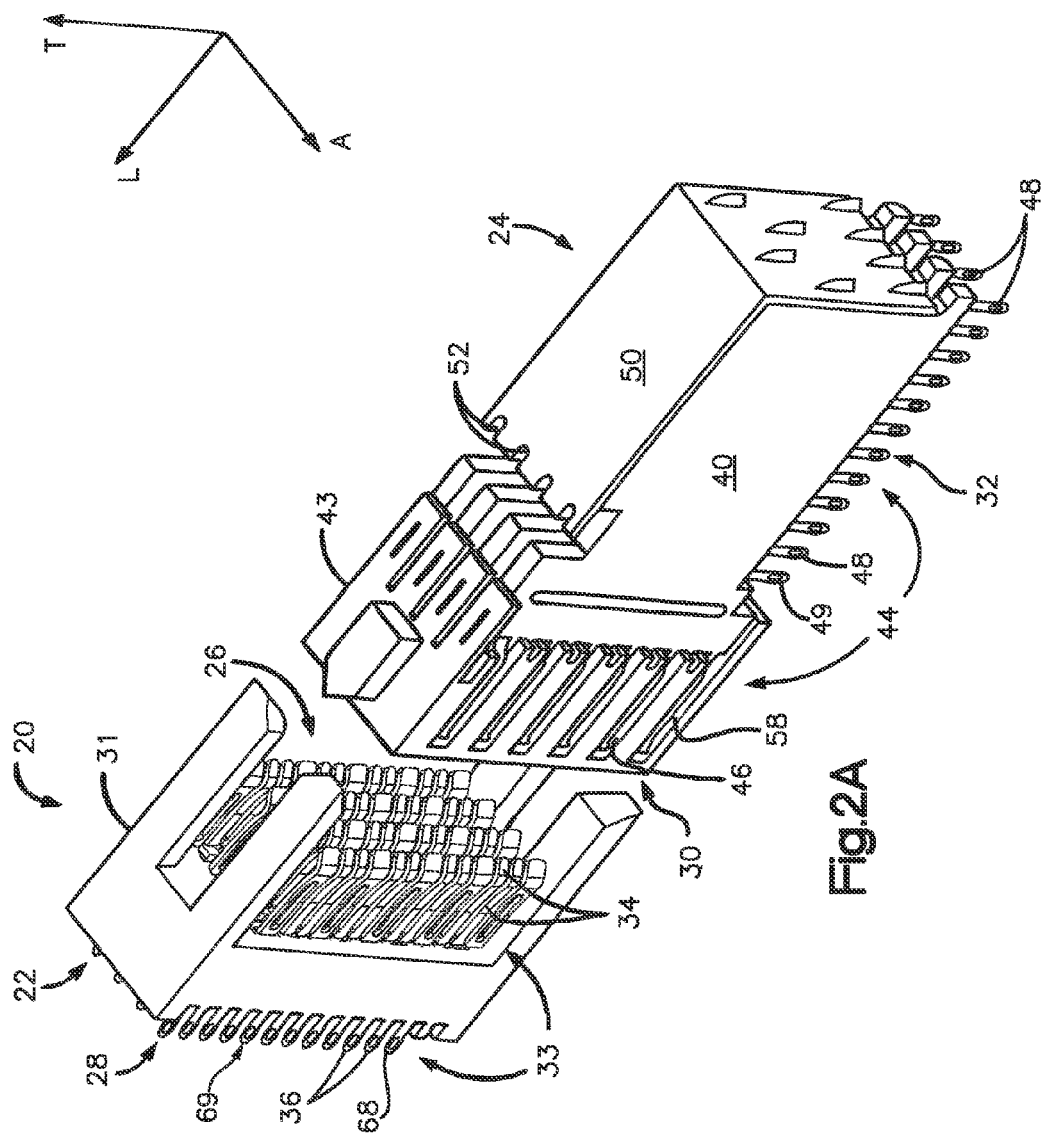
FIG. 2A is a perspective view of the electrical connector assembly similar to FIG. 1, but without the substrates.
Figure 2B:
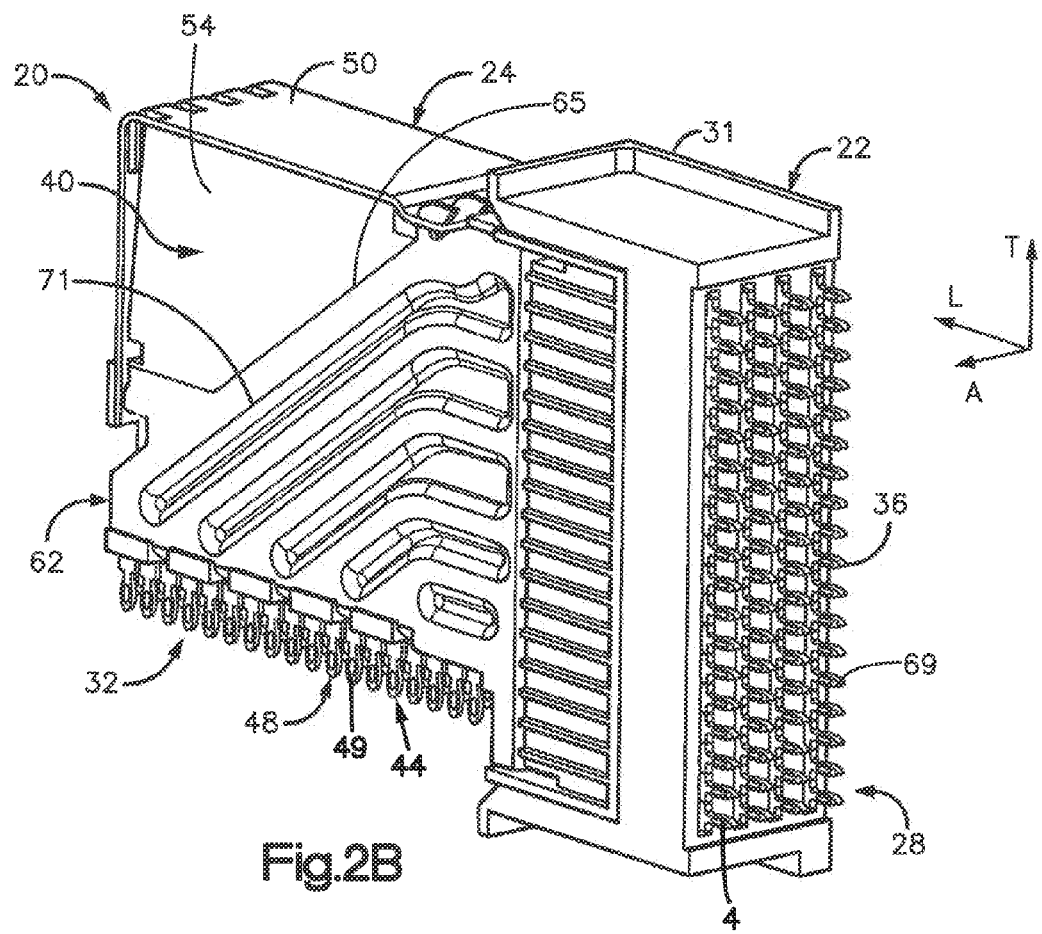
FIG. 2B is another perspective view of the electrical connector assembly as illustrated in FIG. 2A, but showing the electrical connectors in a mated configuration.

Referring initially to FIGS. 1-2B, an electrical connector assembly 20 includes a first electrical connector 22, a first substrate 38, such as a printed circuit board, to which the first electrical connector 22 is configured to be mounted, a second electrical connector 24, and a second substrate 42, to which the second electrical connector 24 is configured to be mounted. The first substrate 38 can be configured as a backplane, and the second substrate 42 can be configured as a daughtercard, though it should be appreciated that the first and second substrates 38 and 42 can be otherwise configured as desired. The first and second electrical connectors 22 and 24 are configured to electrically mate with each other so as to establish an electrical connection between the first and second electrical connectors 22 and 24, and thus also between the first and second substrates 38 and 42 when the first electrical connector 22 is mounted to the first substrate 38 and the second electrical connector 24 is mounted to the second substrate 42.

As shown, the first electrical connector 22 can be a vertical connector defining a mating interface 26 and a mounting interface 28 that is oriented substantially parallel to the mating interface 26. The mating interface 26 and the mounting interface 28 can be spaced from each other along a longitudinal direction L. The mating interface 26 can extend substantially along a respective first plane defined by a lateral direction A that is substantially perpendicular to the longitudinal direction L, and a transverse direction T that is substantially perpendicular to both the longitudinal direction L and the lateral direction A. The mounting interface 28 can extend along a respective second plane that is parallel to the first plane, and thus is defined by the lateral direction and the transverse direction T. The second electrical connector 24 can be a right-angle connector defining a mating interface 30 and a mounting interface 32 that is oriented substantially perpendicular to the mating interface 30. For instance, the mating interface 30 can extend along a respective third plane that is substantially parallel to the first and second planes when the first and second electrical connectors 22 and 24 are mated with each other. Thus, the third plane of the mating interface 30 can extend along the lateral direction A and the transverse direction T. The mounting interface 32 can extend substantially along a fourth plane that is perpendicular to the third plane of the mating interface 30, and thus can extend along the lateral direction A and the longitudinal direction L. Alternatively, the first electrical connector 22 can be a right-angle connector and the second electrical connector 24 can alternatively be a vertical connector. The mating interface 26 of the first electrical connector 22 is configured to mate with the mating interface 30 of the second electrical connector 24 so as to mate the first electrical connector 22 with the second electrical connector 24.

The first electrical connector 22 includes a dielectric, or electrically insulative, connector housing 31 and a plurality of electrical signal contacts 33 supported by the connector housing 31. As will be described in more detail below, the first electrical connector 22 can include a plurality of leadframe assemblies 39 that are supported by the connector housing 31. As illustrated in FIG. 3A, each leadframe assembly 39 can include a dielectric, or electrically insulative, leadframe housing 45, and a plurality of the electrical signal contacts 33 that are supported by the leadframe housing 45. Thus, the electrical signal contacts 33 are supported by the connector housing 31 when the respective leadframe housings 45 are supported by the connector housing 31. The electrical signal contacts 33 can be overmolded by the dielectric leadframe housing 45, stitched into the dielectric leadframe housing 45, or otherwise supported by the dielectric leadframe housing 45. Each leadframe assembly 39 can further include an electrically conductive ground plate 47 that is configured to be attached to the leadframe housing 45. The electrical signal contacts 33 of each leadframe assembly 45 can be spaced from each other along a column direction, for instance the transverse direction T. The leadframe assemblies 45 can be spaced from each other along a row direction that is perpendicular to the column direction, for instance the lateral direction A.

Referring again to FIGS. 1-2B, the electrical signal contacts 33 define respective mating ends 34 that extend along the mating interface 26, and mounting ends 36 that extend along the mounting interface 28. The electrical signal contacts 33 can be constructed as vertical contacts, whereby the mating ends 34 and the mounting ends 36 are oriented substantially parallel to each other. In accordance with the illustrated embodiment, the mating ends 34 and the mounting ends 36 are each elongate along the longitudinal direction L. The mating ends 34 are configured to mate with the electrical contacts of the second electrical connector 24 so as to place the first electrical connector 22 in electrical communication with the second electrical connector 24, and the mounting ends 36 are configured to mount onto the first substrate 38 so as to place the electrical signal contacts 33 in electrical communication with the first substrate 38.

Each of the mating ends 34 can define a perimeter that includes first and second edges 34a that are opposite each other and spaced along a first direction, such as the transverse direction T as illustrated, and first and second broadsides 34b that are opposite each other and spaced from each other along a second direction, such as the lateral direction A as illustrated, that is perpendicular to the first direction. Thus edges 34a can be oriented substantially perpendicular with respect to the broadsides 34b. Each edge 34a can extend between opposed outer ends of the first and second broadsides 34b. Similarly, each broadside 34b can extend between opposed outer ends of the first and second edges 34a. Each of the edges 34a can define a first dimension between its outermost ends along the second or lateral direction A, and each of the broadsides 34b can define a second dimension between its outermost ends along the first or transverse direction T. The first dimension of each of the edges 34a can be substantially equal to each other, and the second dimension of each of the broadsides 34b can be substantially equal to each other. The first dimension of the edges 34a is less than the second dimension of the broadsides 34b. For instance, the edges 34a can define a thickness of the electrical signal contacts 33 of about 0.1 mm to 0.5 mm in the second or lateral direction A. The broadsides 34b can define a height in the first or transverse direction T of about 0.1 mm to 0.9 mm. The electrical signal contacts 33 can thus define material dimensions equal to the thickness and the height, respectively.

The mating ends 34 of the electrical signal contacts 33 can be configured as plugs that are constructed as blades that are linearly elongate, for instance along the longitudinal direction L, that are configured to be received by the complementary electrical contacts of the second electrical connector 24. Accordingly, the first electrical connector 22 can be referred to as a header connector as illustrated, and the second electrical connector can be referred to as a receptacle connector. Alternatively, the electrical signal contacts 33 can be configured as receptacle contacts, whereby the mating ends 34 of the electrical signal contacts 33 are configured to receive the electrical contacts of the second electrical connector 24.

The first electrical connector 22 can include any suitable dielectric material, such as air or plastic, to isolate the electrical signal contacts 33 from one another along either or both of the row direction and the column direction. The mounting ends 36 may be press-fit tails, surface mount tails, or fusible elements such as solder balls, which are configured to electrically connect to a complementary electrical component such as the first substrate 38 which is illustrated as a printed circuit board. The first substrate 38 can be provided as a backplane, midplane, daughtercard, or the like.

The first electrical connector 22 is configured to mate with the second electrical connector 24 in a mating direction, which can be along the longitudinal direction L. The first electrical connector 22 is configured to unmate from the second electrical connector 24 along an unmating direction that is opposite the mating direction along the longitudinal direction L. For instance, the first electrical connector 22 is configured to mate with the second electrical connector 24 along a longitudinally forward mating direction M, which extends along the longitudinal direction L. The leadframe assemblies 39 can be spaced along the lateral direction A, which is substantially perpendicular to the longitudinal direction L and can define the row direction. Each leadframe assembly 39 can be elongate along a transverse direction T, which is substantially perpendicular to both the longitudinal direction L and the lateral direction A. The electrical signal contacts 33, including the mating ends 34 and the mounting ends 36, of each leadframe assembly 39 are spaced from each other along the transverse direction T, which can define the column direction.

As illustrated, the longitudinal direction L and the lateral direction A extend horizontally as illustrated, and the transverse direction T extends vertically, though it should be appreciated that these directions may change depending, for instance, on the orientation of the first electrical connector 22 during use. Unless otherwise specified herein, the terms "lateral," "longitudinal," and "transverse" as used to describe the orthogonal directional components of various components and do not limit to specific differential signal pair configurations. The terms "inboard" and "inner," and "outboard" and "outer" with respect to a specified directional component are used herein with respect to a given apparatus to refer to directions along the directional component toward and away from the center apparatus, respectively.

Because the mating interface 26 is oriented substantially parallel to the mounting interface 28, the first electrical connector 22 can be referred to as a vertical connector, though it should be appreciated that the first electrical connector can be provided in any desired configuration so as to electrically connect the substrate 38 to the second electrical connector 24. For instance, the first electrical connector 22 can be provided as a header connector or a receptacle connector, and can be arranged as a vertical or mezzanine connector or a right-angle connector as desired.

With continuing reference to FIGS. 1-2B, the second electrical connector 24 can be configured as a receptacle connector including a dielectric, or electrically insulative, second connector housing 43 and a plurality of electrical signal contacts 44 that are supported by the second connector housing 43. Thus, the electrical signal contacts 44 can include respective mating ends 46 that extend along the mating interface 30, and respective mounting ends 48 that extend along the mounting interface 32. The mating ends 46 can be oriented substantially perpendicular with respect to the mounting ends 48, such that the electrical signal contacts 44 are right-angle signal contacts, though it should be appreciated that the electrical signal contacts 44 can alternatively be configured as vertical contacts whereby the mating ends 46 and the mounting ends 48 can be oriented parallel to each other.

The second electrical connector 24 can further include a plurality of leadframe assemblies 40 that are supported by the second connector housing 43. Each leadframe assembly 40 can include a second leadframe housing 54 and a plurality of electrical signal contacts 44 supported by the second leadframe housing 54. For instance, the electrical signal contacts 44 can be overmolded by the second leadframe housing 54 such that the leadframe assemblies 40 are configured as insert molded leadframe assemblies (IMLAs), or stitched into the second leadframe housing 54 as desired. The mounting ends 48 may be constructed as described herein with respect to the mounting ends 36 of the electrical signal contacts 33 of the first electrical connector 22, and thus may include press-fit tails, surface mount tails, or fusible elements such as solder balls, which are configured to electrically connect to a complementary electrical component such as the second substrate 42 which is illustrated as a printed circuit board. The second substrate 42 can be provided as a backplane, midplane, daughtercard, or the like. The mating ends 46 are configured to electrically connect to the respective mating ends 34 of the first electrical connector 22 when the respective mating interfaces 26 and 30 are engaged. The electrical signal contacts 44 may define edges as described above that can define a thickness of the electrical signal contacts 33 of about 0.1 mm to 0.5 mm in the second or lateral direction A, and broadsides as described above that can define a height in the first or transverse direction T of about 0.1 mm to 0.9 mm. The electrical signal contacts 44 can thus define material dimensions equal to the thickness and the height, respectively.

The leadframe assemblies 40 of the second electrical connector 24 can also include a ground plate 62 that is attached to the second leadframe housing 54. The ground plate 62 can include a ground plate body 65 and at least one rib 74, such as a plurality of ribs 74 that can be embossed, for instance stamped, in the ground plate body 65 and is configured to be aligned with the electrical signal contacts 44 along the column direction. Each of the leadframe assemblies 40 can further define a plurality of ground mating ends 58 that extend from the ground plate body 65 at the mating interface 30, and a plurality of ground mounting ends 49 that extend from the ground plate body 65 at the mounting interface 32. For instance, the ground mating ends 58 and the ground mounting ends 49 can be integral and monolithic with the ground plate 62. It should be appreciated that the leadframe assemblies 40 can alternatively include dedicated individual ground contacts that are supported by the leadframe housing 54 in the same manner as the electrical signal contacts 44.

The ground mating ends 58 are aligned with the mating ends 46 of the electrical signal contacts 44, for instance along the transverse direction T, and the ground mounting ends 49 are aligned with the mounting ends 48 of the electrical signal contacts 44, for instance along the longitudinal direction L, when the ground plate 62 is attached to the second leadframe housing 54. For instance, one or more up to all of the ground mating ends 58 can be disposed between the mating ends 46 of adjacent differential signal pairs that can each defined by adjacent ones of the electrical signal contacts 44, and one or more up to all of the ground mounting ends 49 can be disposed between the mounting ends 48 of the adjacent differential signal pairs. In accordance with the illustrated embodiment, the ground mating ends 58 are oriented perpendicular with respect to the ground mounting ends 49. Alternatively, the ground mating ends 58 could be oriented parallel with respect to the ground mounting ends 49. The leadframe assemblies 40 are described in more detail in U.S. Pat. No. 8,366,485 and U.S. Pat. No. 8,231,415, the disclosure of each of which is hereby incorporated by reference as if set forth in its entirety herein. The second electrical connector 24 may further include an organizer 50 that may be electrically insulative or electrically conductive and retains the leadframe assemblies 40 in relationship to the second connector housing 43. For instance, the organizer can be electrically connected to electrically conductive portions of the leadframe assemblies 40 via slits 52 defined in the organizer 50 or any other suitable connection.

Thus, it should be appreciated that the second electrical connector 24 includes the second connector housing 43 and a plurality of electrical contacts supported by the second connector housing 43. The electrical contacts supported by the second connector housing 43 can define the mating ends 46 and mounting ends 48 of the electrical signal contacts 44, and can further include the ground mating ends 58 and the ground mounting ends 49. In accordance with the illustrated embodiment, select ones of the electrical contacts that are supported by the second connector housing 43 are included in respective ones of the leadframe assemblies 40, and supported by the corresponding leadframe housing 54. The ground mating end 58 and the ground mounting ends 49 can be defined by the ground plate 62, or by individual ground contacts as described above.

Because the mating interface 30 is substantially perpendicular to the mounting interface 32, the second electrical connector 24 can be referred to as a right-angle connector, though it should be appreciated that the first electrical connector can be provided in any desired configuration so as to electrically connect the substrate 42 to the first electrical connector 22. For instance, the second electrical connector 24 can be provided as a receptacle connector or a header connector, and can be arranged as a vertical or mezzanine connector or a right-angle connector as desired. When the connectors 22 and 24 are mounted onto their respective substrates 38 and 42 and electrically connected to each other, the corresponding first and second substrates 38 and 42 can be placed in electrical communication.

Referring now to FIGS. 3A-4, and as described above, each leadframe assembly 39 of the first electrical connector 22 can include a dielectric, or electrically insulative, leadframe housing 45, a plurality of the electrical signal contacts 33 that are supported by the leadframe housing 45, and an electrically conductive ground plate 47 that is attached to the leadframe housing 45. The leadframe housing 45 can be made of any suitable dielectric material such as plastic, and the electrical signal contacts 33 can be overmolded by the leadframe housing 45, such that each leadframe assembly 39 can define an insert molded leadframe assembly (IMLA), or otherwise supported by the leadframe housing 45. For instance, the electrical signal contacts 33 can be stitched in the leadframe housing 45. The electrical signal contacts 33 can be arranged in pairs, which can define respective differential signal pairs 57. For instance, adjacent ones of the electrical signal contacts 33 of a leadframe assembly 39 can define a differential signal pair. Because the edges 34a of the adjacent signal contacts 33 of the differential signal pair 57 face each other, the signal contacts 33 of each differential signal pair 57 can be said to be edge-coupled. Alternatively, the electrical signal contacts 33 can be provided as single-ended signal contacts. One or more up to all of adjacent differential signal pairs 57 can be separated from each other along the transverse direction T by a gap 59. Otherwise stated, the electrical signal contacts 33 as supported by the leadframe housing 45 can define a gap 59 disposed between adjacent differential signal pairs 57.

Figure 5A:
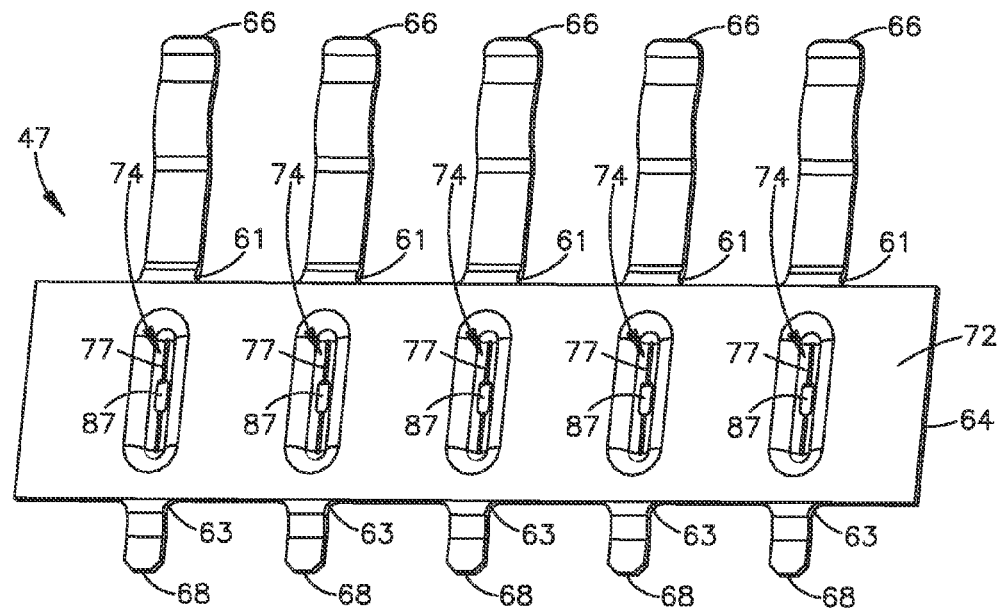
FIG. 5A is a perspective view of the embossed ground plate illustrated in FIG. 3A.
Figure 5B:
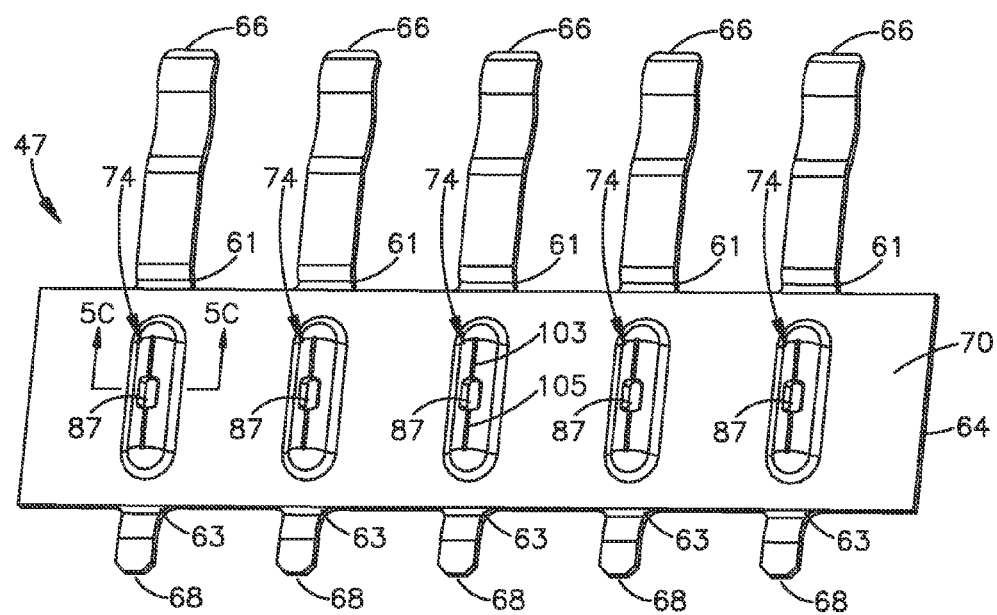
FIG. 5B is another perspective view of the embossed ground plate illustrated in FIG. 5A.
Figure 5C:
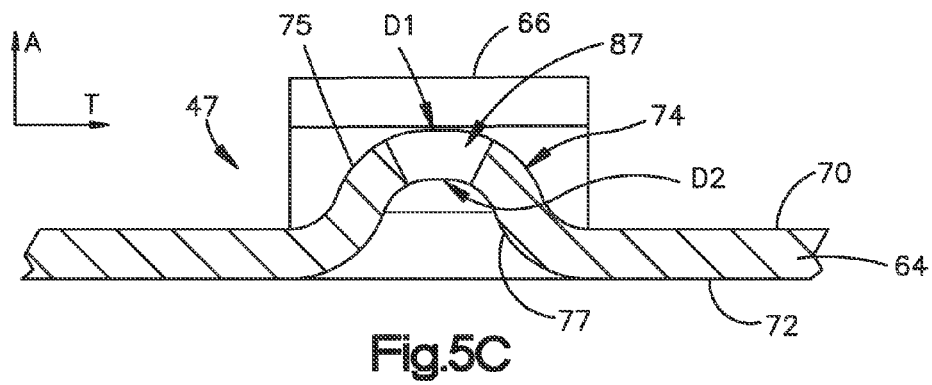
FIG. 5C is a sectional view of a portion of the embossed ground plate illustrated in FIG. 5B, taken along line 5C-5C through an aperture.
Figure 6A:
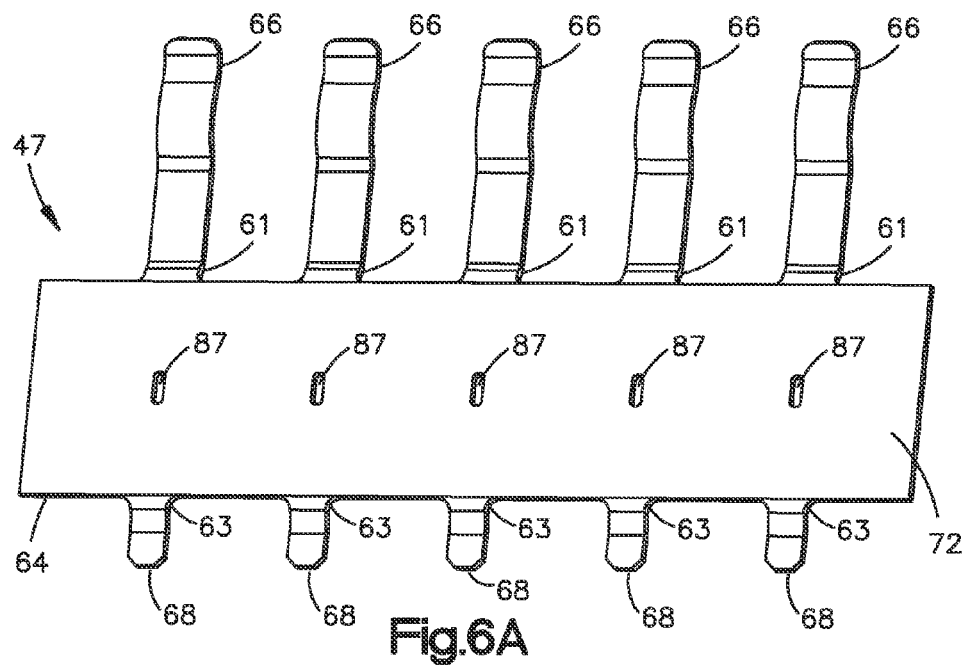
FIG. 6A is a perspective view of the ground plate illustrated in FIG. 5A prior to creating the embossments.
Figure 6B:
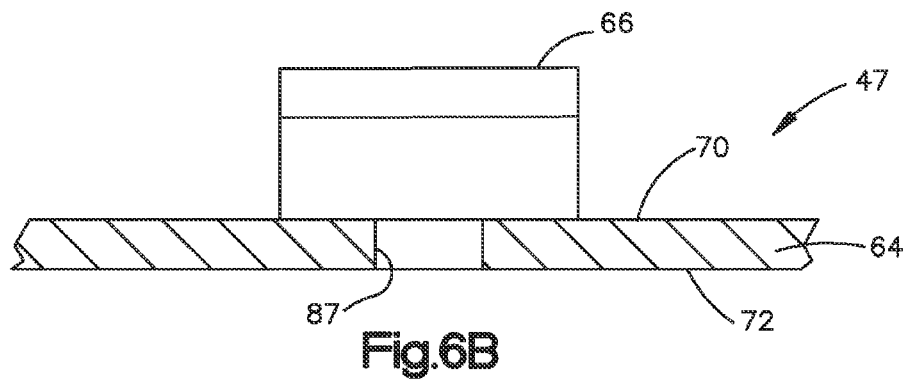
FIG. 6B is a sectional view of a portion of the ground plate illustrated in FIG. 6A through the aperture illustrated in FIG. 5C prior to creating the embossments.

The leadframe housing 45 includes a housing body 51 that defines a first surface 53 that faces the ground plate 47 when the ground plate 47 is attached to the leadframe housing 45, and an opposed second surface 55 that is spaced from the first surface 53 along the lateral direction A. Similarly, the ground plate 47 includes a ground plate body 64 that defines an inner or first plate body surface 70 (FIG. 5B) and an opposed outer or second plate body surface 72 (FIG. 5A) that is spaced from the first plate body surface 70 along the lateral direction A. The first plate body surface 70 faces the ground plate 47 when the ground plate 47 is attached to the leadframe housing 45.

The ground plate 62 can be formed from any suitable electrically conductive material, such as a metal.

The first electrical connector 22, for instance, each of the leadframe assemblies 39 can further define a plurality of ground mating ends 66 and a plurality of ground mounting ends 68. The ground mating ends 66 can extend from the ground plate body 64 at the mating interface 26, and the ground mounting ends 68 can extend from the ground plate body 65 at the mounting interface 28. Alternatively, the leadframe assemblies 39 can include dedicated individual ground contacts that are supported by the leadframe housing 45 in the same manner as the electrical signal contacts 33. In accordance with the illustrated embodiment, the ground mating ends 66 and the ground mounting ends 58 are integral and monolithic with the ground plate body 64. For instance, the ground mating ends 66 can extend forward from the ground plate body 64 along the longitudinal direction L, and the ground mounting ends 68 can extend rearward (opposite the mating direction) from the ground plate body 64 along the longitudinal direction L. The ground mating ends 66 are configured to electrically connect to the ground mating ends 58 of the complementary second electrical connector 24. The ground mounting ends 58 are configured to electrically connect to electrical traces of a printed circuit board, such as the first substrate 38.

The ground mating ends 66 are aligned with each other and the mating ends 34 of the electrical signal contacts 33 along the transverse direction T when the ground plate 47 is attached to the leadframe housing 45. The ground mounting ends 68 can also be aligned with each other and the mounting ends 36 of the electrical signal contacts 33 along the transvers direction T when the ground plate 47 is attached to the leadframe housing 45. Thus, the ground mating ends 66 and the ground mounting ends 68 can be oriented substantially parallel to each other. It should be appreciated, of course, that the ground plate 47 can be configured to attach to a right-angle leadframe assembly such that the ground mating ends 66 and the ground mounting ends 68 are oriented substantially perpendicular to each other. For instance, the ground mounting ends 68 can be aligned with each other and the mounting ends 36 of the electrical signal contacts 33 along the longitudinal direction L. The ground mating ends 66 and the ground mounting ends 68 can be constructed as described above with respect to the mating ends 34 and the mounting ends 36 of the electrical signal contacts 33.

For instance, one or more up to all of the ground mating ends 66 can be disposed between the mating ends 34 of adjacent ones of the differential signal pairs 57 that can each defined by adjacent ones of the electrical signal contacts 33, and one or more up to all of the ground mounting ends 68 can be disposed between the mounting ends 36 of the adjacent ones of the differential signal pairs 57.

The ground plate 47 can include a first neck 61 that extends between the ground plate body 64 and each ground mating end 66, and a second neck 63 that extends between the ground plate body 64 and each ground mounting end 68. The first and second necks 63 can extend out from the ground plate body 64 along the longitudinal direction L, and can further extend along the lateral direction A along a direction from the second plate body surface 72 toward the first plate body surface 70, such that the ground mating ends 66 and the ground mounting ends 68 that extend out from the first and second necks 61 and 63, respectively, are substantially co-planar with the mating ends 34 of the electrical signal contacts 33 and the mounting ends 36 of the electrical signal contacts 33, respectively.

The ground mating ends 66 are positioned adjacent at least one of the mating ends 34 of the differential signal pairs 57, for instance between adjacent ones of the differential signal pairs 57, and the ground mounting ends 68 are positioned adjacent at least one mounting end 36 of the differential signal pairs 57, for instance between adjacent ones of the differential signal pairs 57. Thus, as illustrated in FIGS. 1-2B, the first electrical connector 22 defines a plurality of mating ends 67 that can include both the mating ends 34 and the ground mating ends 66, and a plurality of mounting ends 69 that can include both the mounting ends 36 and the ground mounting ends 68. The leadframe assemblies 39 can include respective pluralities of the mating ends 67 and the mounting ends 69. The dimensions of the first electrical connector 22 can remain unchanged with respect to electrical connectors that include the same number of leadframe assemblies and the same number of mating ends 67 and mounting ends 69, whose leadframe assemblies carry discrete ground contacts that are overmolded or stitched into the leadframe housing, for instance as described in U.S. Pat. No. 7,497,736, the disclosure of which is hereby incorporated by reference as if set forth in its entirety herein.

In accordance with the illustrated embodiment, the ground mating ends 66 of the ground plate 47 are disposed in respective ones of the gaps 59 that are disposed between the mating ends 34 of the signal contacts 33 of adjacent differential signal pairs 57, such that the first electrical connector 22 defines the mating ends 67, which can be equidistantly spaced along the mating interface 26 of the first electrical connector 22. Likewise, the ground mounting ends 68 of the ground plate 47 are disposed in respective ones of the gaps 59 that are disposed between the mounting ends 36 of the signal contacts 33 of adjacent differential signal pairs 57, such that the mounting ends 69 are equidistantly spaced along the mounting interface 28 of the first electrical connector 22. The leadframe assemblies 39 can define a repeating pattern of signal contacts "S" and ground contacts "G" along the mating interface 26 and the mounting interface 28 as desired, where "S" denotes mating ends or mounting ends of the electrical signal contacts 33, and "G" denotes ground mating ends or ground mounting ends of the ground plate 47. For instance, the leadframe assemblies 39 can define a repeating S-S-G pattern, a repeating S-G-S configuration, or a repeating G-S-S configuration. Furthermore, different ones of the leadframe assemblies 39 can define different patterns of signal contacts "S" and ground contacts "G".

The ground plate 47 can be electrically conductive, and thus configured to reflect electromagnetic energy produced by the electrical signal contacts 33 during use, though it should be appreciated that the ground plate 47 could alternatively be configured to absorb electromagnetic energy. For instance the ground plate 47 can be made from an electrically conductive metal, a lossy material, or a combination of electrically conductive metal and lossy material. The lossy material can be any suitable magnetically absorbing material, and can be either electrically conductive or electrically nonconductive. For instance the ground plate 47 can be made from one or more ECCOSORB® absorber products, commercially available from Emerson & Cuming, located in Randolph, Mass. The ground plate 47 can alternatively be made from one or more SRC PolyIron® absorber products, commercially available from SRC Cables, Inc, located in Santa Rosa, Calif. Electrically conductive or electrically nonconductive lossy material can be coated, for instance injection molded, onto the opposed first and second plate body surfaces of the ground plate body 64 that carry the ribs 74 as described below with reference to FIGS. 3A-5C. Alternatively, electrically conductive or electrically nonconductive lossy material can be formed, for instance injection molded, to define a lossy ground plate body 64 of the type described herein. The ground mating ends 66 and the ground mounting ends 68 can be attached to the lossy ground plate body 64 so as to extend from the lossy ground plate body 64 as described herein. Alternatively, the lossy ground plate body 64 can be overmolded onto the ground mating ends 66 and the ground mounting ends 68. Alternatively still, when the lossy ground plate body 64 is nonconductive, the lossy ground plate 47 can be devoid of ground mating ends 66 and ground mounting ends 68. Furthermore, the ground plates 47 are disposed between the electrical signal contacts 33 of adjacent leadframe assemblies 39, such that the ground plates 47 can provide shields that reduce cross-talk between signal the electrical signal contacts 33 of adjacent leadframe assemblies 39.

Each leadframe assembly 39 can further include an engagement assembly that is configured to attach the ground plate 47 to the leadframe housing 45. For instance, the engagement assembly can include at least one engagement member 98 of the ground plate 47, supported by the ground plate body 64, and in particular by the first surface 53, and a complementary at least one engagement member 91 of the leadframe housing 45 that is supported by, for instance defined by the housing body 51. The engagement member 98 of the ground plate 47 is configured to attach to the engagement member 91 of the leadframe housing 45 so as to secure the ground plate 47 to the leadframe housing 45. In accordance with the illustrated embodiment, the engagement member 98 is configured as an aperture 87 that extends through the ground plate body 64 from the first plate body surface 70 through the second plate body surface 72, for instance along the lateral direction A. Thus, it can be said that the first and second plate body surfaces 70 and 72 are spaced along a first direction, such as the lateral direction A, and the aperture 87 extends through the ground plate body 64 along the first direction. The apertures 87 can be aligned with, and disposed between the ground mating ends 66 and the ground mounting ends 68 along the longitudinal direction L. For instance, the apertures 87 can be disposed substantially centrally with respect to the ground mating ends 66 and the ground mounting ends 68 along the transverse direction T.

The apertures 87 define a first end, for instance at the first plate body surface 70, that defines a first dimension D1 along a select direction, such as the transverse direction T, and a second end, for instance at the second plate body surface 72, that can define a second dimension D2 along the select direction, whereby the first dimension D1 is greater than the second dimension D2. Thus, the select direction can be oriented substantially perpendicular to the first direction, and substantially perpendicular to the mating direction M. The aperture 87 can be elongate along a direction of elongation, which is substantially perpendicular to the first direction, for instance the longitudinal direction L, such that the select direction is perpendicular to both the first direction and the direction of elongation. The select direction can thus be substantially parallel to the transverse direction T. In accordance with the illustrated embodiment, the aperture 87 can be at least partially defined by opposed sloped interior surfaces 97 that can extend between the first plate body surface 70 and the second plate body surface 72 of the ground plate body 64 that extend along respective straight axes 99a and 99b that intersect each other at a location spaced from the second plate body surface 72 along the lateral direction A.

With continuing reference to FIGS. 3A-4, the engagement member 91 of the leadframe housing 45 can be configured as a protrusion 93 that is supported by the housing body 51. For instance, the protrusion 93 can be defined by the housing body 51, and thus can be integral and monolithic with the housing body 51. In accordance with one embodiment, the protrusion 93 can extend out from the first surface 53 along the lateral direction A from the second surface 55 toward the first surface 53. The protrusion 93 can define a base 93a that is disposed proximate to the first surface 53, a free tip 93b that is opposite the base 93a along the lateral direction A, and a middle portion 93c that extends along the lateral direction A between the base 93a and the free tip 93b. Thus, the protrusion 93 extends away from both the first and second surfaces 53 and 55. At least a portion of the protrusion 93 can define a cross-sectional dimension along the select direction that is substantially equal to or slightly greater than the second dimension D2, and thus less than the first dimension D1. Accordingly, the portion of the protrusion 93 can extend through the first end of the aperture 87 and can be press fit into the second end of the aperture 87 so as to attach the ground plate 47 to the leadframe housing 45. Thus, the first dimension D1 of the apertures 87 can define a lead-in for the protrusions 93 are they inserted and press-fit in the apertures 87. In accordance with the illustrated embodiment, the cross-sectional dimension of the protrusion 93 at the free tip 93b is less than the second dimension D2, and the cross-sectional dimension of the protrusion 93 at the middle portion 93c is at least equal to the second dimension D2. The cross-sectional dimension of the protrusion 93 at the base 93a can be greater than the second dimension D2. The cross-sectional dimension can be along a direction that is substantially perpendicular to the lateral direction A, such as the transverse direction T.

The leadframe housing 45 can define a recessed region 95 that extends into the housing body 51 along the lateral direction A. For instance, the recessed region 95 can extend into the first surface 53 and terminate without extending through the second surface 55. Thus, the recessed region 95 can define a recessed surface 101 that is disposed between the first surface 53 and the second surface 55 along the lateral direction A. The recessed surface 101 and the first surface 53 can cooperate to define the external surface of the leadframe housing 45 that faces the ground plate 47 when the ground plate 47 is attached to the leadframe housing 45. The recessed region 95 is spaced from the second surface 55 a distance that is less than the distance that the first surface 53 is spaced from the second surface 55 along the lateral direction A. The protrusion 93 can extend out from the recessed region 95, for instance from the recessed surface 101 along a direction away from the second surface 55 and toward the first surface 53. The first surface 53 and the recessed surface 101 can extend substantially along respective planes that are defined by the longitudinal direction L and the transverse direction T, though it should be appreciated that one or both of the first surface 53 and the recessed surface 101 can define any shape and extend along any direction as desired. The protrusion 93 can extend out from the recessed surface 101 to a location that substantially lies in the plane defined by the first surface 53. Thus, the free tip 93b can be substantially co-planar with the first surface 53.

Referring now to FIGS. 3A-5C, the ground plate 47 includes at least one rib 74, such as a plurality of ribs 74 supported by the ground plate body 64. In accordance with the illustrated embodiment, each rib 74 can be stamped or embossed into the ground plate body 64, and is thus integral and monolithic with the ground plate body 64. Thus, the ribs 74 can further be referred to as embossments. As illustrated, each rib 74 defines a first rib surface 75 that defines a projection that extends out from the first plate body surface 70, for instance along the lateral direction A from the second plate body surface 72 toward the first plate body surface 70. Each rib 74 thus also extends out from the first plate body surface 70 toward the first surface 53 of the housing body 51 of the leadframe housing 45 to which the ground plate 47 is attached. Each rib 74 further defines a second rib surface 77 that is opposite the first rib surface 75 along the lateral direction A. The second rib surface 77 defines a corresponding aperture 87 that extends into the second plate body surface 72 of the ground plate body 64. The second rib surface 77 can extend to a location that is disposed between the first rib surface 75 and the first plate body surface 70.

Thus, it can be said that the ground plate body 64 includes a plurality of projections that extend out the first plate body surface 70 along the lateral direction A, and further includes a plurality of apertures that extend into the second plate body surface 72 along the lateral direction A. The ribs 74 define respective enclosed outer perimeters 80 that are spaced from each other along the ground plate body 64. Thus, the ribs 74 are fully contained in the ground plate body 64. The ribs 74 can be aligned with the ground mating ends 66 and the ground mounting ends 68 along the longitudinal direction L, and disposed substantially centrally with respect to the ground mating ends 66 and the ground mounting ends 68 along the transverse direction T. The ribs 74 can be elongate along the longitudinal direction L between the ground mating ends 66 and the ground mounting ends 68.

The ribs 74 can extend from the ground plate body 64, for instance from the first plate body surface 70, a distance along the lateral direction A sufficient such that a portion 103 of each rib 74 extends into a plane that is defined by at least a portion of the electrical signal contacts 33. The plane can be defined by the longitudinal and transverse directions L and T. For instance, the portion 103 of the first rib surface 75 can define a flat 105 that extends along a plane that is co-planar with a surface of the ground mating ends 66, and thus also with a surface of the mating ends 34 of the signal contacts when the ground plate 47 is attached to the leadframe housing 45. A remainder of the first rib surface 75 can be curved between opposed ends that extend out from the first plate body surface 70. The surface of the ground mating ends 66 and the mating ends 34 of the signal contacts 33 that is aligned with the portion 103 of the first rib surface 75 can, for instance, be a laterally outermost surface of the ground mating ends 66 and the mating ends 34 of the signal contacts 33, respectively. Thus, the outermost surface of the ribs 74 with respect to the lateral direction A can be said to be aligned with the outermost surfaces of the ground mating ends 66 and the mating ends 34 of the signal contacts 33 with respect to the lateral direction A along a plane that is defined by the longitudinal direction L and the transverse direction T.

The ribs 74 are aligned with the gaps 59 along the longitudinal direction L when the ground plate, such that the ribs 74 extend into the recessed region 95 of the leadframe housing 45 when the ground plate 47 is attached to the leadframe housing 45. Thus, the recessed region 95 is also aligned with the gaps 59 along the longitudinal direction L. The apertures 87 that extend through the ground plate body 64 can extend through the ribs 74, such that each rib 74 defines a corresponding one of the apertures 87. Thus, it can be said that the engagement members 98 of the ground plate 47 are supported by, for instance defined by, respective ones of the ribs 74. Accordingly, the ground plate 47 can include at least one engagement member 98 that is supported by, for instance defined by, at least one or more up to all of the ribs 74. For instance, the apertures 87 can be substantially centrally disposed in the corresponding ribs 74 with respect to both the lateral direction A (and thus the above-described select direction) and the longitudinal direction L. In accordance with the illustrated embodiment, the apertures 87 can extend through the flats 105.

Accordingly, the ground plate body 64, for instance at one or more up to all of the ribs 74, can define the interior surfaces 97 that, in turn, define the apertures 87 as described above. One or more up to all of the interior surfaces 97 of the ground plate body 64 can be inwardly tapered along a direction from the outer or first surface 75 to the inner or second surface 77. Thus, the first dimension D1 along the select direction, such as the transverse direction T, can be greater than the second dimension D2 along the select direction as described above. It is appreciated that the interior surface 97 of the ground plate body 64 can define a conical shape in cross-section along a plane that includes the select direction and a second direction that is perpendicular to the select direction. For instance the second direction of the plane can be the lateral direction A. The protrusion 93 can define a substantially constant dimension in cross-section along the plane at a location at which the protrusion 93 extends through the aperture 87 when the ground plate 47 is attached to the leadframe housing 45.

Thus, at least one or more up to all of the apertures 87 and the interior surface 97 that defines the at least one or more up to all of the apertures 87, can define a first cross-sectional shape along the plane, such as a conical shape, and the at least one or more up to all of the protrusions 93 can define a second cross-sectional shape along the plane that is different than the first cross-sectional shape at a location at which the protrusion 93 extends through the aperture 87 when the ground plate 47 is attached to the leadframe housing 45. The second cross-sectional shape can, for instance, be substantially rectangular. It can further be said that the engagement member 98 of the ground plate 47 can define a first cross-sectional shape along the plane, the engagement member 91 of the leadframe housing 45 can define the second cross-sectional shape along the plane that is different than the first cross-sectional shape at a location at which the engagement members 91 and 98 engage when the ground plate 47 is attached to the leadframe housing 45.

It is believed that the ground plate 47 provides a low-impedance common path that intercepts and dissipates stray electro-magnetic energy between electrical signal contacts 33 that otherwise would have been a source for cross talk. It is believed that a connector that incorporates the leadframe assemblies 39 as described above can operate at 13 GHz with acceptable worst-case, multi-active crosstalk on a victim pair of no more than six percent, for instance less than one percent, such as 0.4 percent. Worst case, multi-active crosstalk may be determined in the manner described in U.S. Pat. No. 7,497, 736, the disclosure of which is hereby incorporated by reference as if set forth in its entirety herein.

Referring now to FIGS. 3A-6B, a method of constructing a leadframe assembly, such as the leadframe assembly 39, can include the steps of creating at least one aperture, such as at least one of the apertures 87, through an electrically conductive plate, such as the ground plate 47, along a first direction from a first surface of the ground plate, such as the first plate body surface 70, through an opposed second surface, such as the second plate body surface 72. The aperture 87 defines a first dimension at the first surface and a second dimension at the second surface, wherein the first and second dimensions are measured along a second direction, such as the above-described select direction, that is substantially perpendicular to the first direction. The method can further include the step of, after the creating step, increasing the first dimension and decreasing the second dimension.

For instance, after the apertures 87 are created, the method can include the step of embossing the ground plate 47 at a region that defines the apertures 87 so as to create the ribs 74, such that the apertures 87 extend through corresponding ones of the ribs 74. As the ribs 74 are embossed in the ground plate body 64 along a direction from the second plate body surface 72 toward the first plate body surface 70, the first dimension of the corresponding apertures 87 increases and the second dimension of the corresponding apertures 87 decreases. In accordance with the illustrated embodiment, the region defines an entirety of the aperture 87, such that each of the ribs 74 defines an entirety of the corresponding aperture 87 that extends through the ribs 74.

The method of constructing the leadframe assembly 39 can further include the step of supporting a plurality of electrical signal contacts, such as the electrical signal contacts 33, in a dielectric housing, such as the leadframe housing 45. For instance, the dielectric housing can be overmolded onto the electrical signal contacts 33. The method can further include the step of receiving a protrusion, such as the protrusion 93, of the leadframe housing 45 in the aperture 87 so as to attach the ground plate 47 to the leadframe housing 45. The method can further include the steps of receiving the protrusion 93 through the first dimension of the aperture 87, and press-fitting the protrusion 93 to the ground plate 47 at the second dimension of the aperture 87. The receiving step can further include aligning the mating ends 34 of the electrical signal contacts 33 with the ground mating ends 66, and aligning the mounting ends 36 of the electrical signal contacts 33 with the ground mounting ends 68.

The foregoing description is provided for the purpose of explanation and is not to be construed as limiting the invention. While various embodiments have been described with reference to preferred embodiments or preferred methods, it is understood that the words which have been used herein are words of description and illustration, rather than words of limitation. Furthermore, although the embodiments have been described herein with reference to particular structure, methods, and embodiments, the invention is not intended to be limited to the particulars disclosed herein. Those skilled in the relevant art, having the benefit of the teachings of this specification, may effect numerous modifications to the invention as described herein, and changes may be made without departing from the spirit and scope of the invention as defined by the appended claims.

What is claimed:

1. An electrical connector comprising:
a dielectric housing including a housing body that defines a first housing surface and a second housing surface opposite the first surface, wherein the dielectric housing includes at least one engagement member that is supported by the first housing surface;
a plurality of electrical signal contacts supported by the dielectric housing; and
a ground plate including a ground plate body that defines a first plate body surface configured to face the first housing surface when the ground plate is attached to the dielectric housing and a second plate body surface opposite the first plate body surface, the ground plate including at least one rib that defines first and second opposed rib surfaces, wherein the first rib surface projects from the first plate body surface and the second rib surface is recessed into the second plate body surface,
wherein the ground plate defines at least one engagement member that is supported by the rib, and is engagement member of the dielectric housing is configured to attach to the at least one engagement member of the ground plate so as to secure the ground plate to the dielectric housing.

2. The electrical connector as recited in claim 1, wherein the at least one engagement member of the dielectric housing comprises at least one protrusion that extends from the first housing surface, and the at least one engagement member of the ground plate comprises an aperture that extends through the rib, the aperture defining a first dimension along a select direction at the first plate body surface, and a second dimension along the select direction at the second plate body surface, such that the second dimension is less than the first dimension, so that the protrusion is configured to attach to the ground plate in the recess.

3. The electrical connector as recited in claim 2, wherein the rib is embossed in the ground plate body.

4. The electrical connector as recited in claim 2, wherein the dielectric housing defines a recessed region in the housing body such that the protrusion extends out from the recessed region.

5. The electrical connector as recited in claim 4, wherein the first surface extends along a plane, and the protrusion extends from the recessed region to the plane.

6. The electrical connector as recited in claim 4, wherein the rib extends into the recessed region when the ground plate is secured to the dielectric housing.

7. The electrical connector as recited in claim 1, wherein the dielectric housing is overmolded onto the signal contacts.

8. The electrical connector as recited in claim 2, wherein the ground plate defines ground mounting ends and ground mating ends, such that when the ground plate is secured to the dielectric housing, the ground mounting ends are aligned with mounting ends of the signal contacts, and ground mating ends aligned with mating ends of the signal contacts.

9. The electrical connector as recited in claim 8, wherein the ground mounting ends and the ground mating ends are oriented substantially parallel to each other.

10. The electrical connector as recited in claim 8, wherein a portion of the at least one rib lies in a plane that is co-planar with a portion of the ground mounting ends.

11. The electrical connector as recited in claim 10, wherein the portion of the at least one rib is an outermost surface of the at least one rib, and the portion of the ground mounting ends is an outermost surface of the ground mounting ends.

12. The electrical connector as recited in claim 11, wherein the portion of the at least one rib defines a flat.

13. The electrical connector as recited in claim 11, wherein the portion of the at least one rib is further coplanar with an outermost surface of the mating ends of the signal contacts when the ground plate is secured to the dielectric housing.

14. The electrical connector as recited in claim 2, wherein the rib is monolithic with the ground plate body.

15. The electrical connector as recited in claim 2, wherein the first and second plate body surfaces are spaced along a first direction, and the aperture extends through the rib along the first direction.

16. The electrical connector as recited in claim 15, wherein the select direction is substantially perpendicular to the first direction.

17. The electrical connector as recited in claim 16, wherein the aperture is substantially centrally disposed in the rib along the select direction.

18. The electrical connector as recited in claim 16, wherein the electrical connector is configured to electrically connect to a complementary electrical connector along a mating direction, and the select direction is substantially perpendicular to the mating direction.

19. The electrical connector as recited in claim 16, wherein the aperture is elongate along a direction of elongation that is substantially perpendicular to the first direction, and the select direction is perpendicular to the direction of elongation.

20. The electrical connector as recited in claim 16, wherein the ground plate body defines ground mounting ends configured to electrically connect to electrical traces of a printed circuit board, the ground mounting ends are aligned along a second direction that substantially perpendicular to the first direction, and the select direction is substantially parallel to the second direction.

21. The electrical connector as recited in claim 20, wherein the ground plate body defines ground mating ends configured to electrically connect to ground mating ends of a complementary electrical connector, the ground mating ends are aligned along the second direction.

22. The electrical connector as recited in claim 2 further comprising a plurality of electrical signal pairs defining respective gaps between adjacent electrical signal pairs, wherein the ground plate defines a plurality of ribs that defines opposed first and second surfaces, the first surface of each rib projects from the first surface of the ground plate body in a direction toward a corresponding one of the gaps, and the second surface of each rib is recessed into the second surface of the ground plate body.

23. The electrical connector as recited in claim 2, wherein the electrical connector has the same overall dimension as a substantially identically constructed electrical connector that does not include the ground plate and instead includes discrete an electrical ground contact disposed in the gap.

24. The electrical connector as recited in claim 2, wherein the pairs of electrical signal contacts comprise differential pairs.

25. The electrical connector as recited in claim 2, wherein the electrical signal contacts are vertical contacts.

26. The electrical connector as recited in claim 2, wherein the ground plate body defines opposed interior surfaces of the ground plate body that partially define the aperture, and the opposed interior surfaces extend along axes that intersect each other.

27. The electrical connector as recited in claim 2, wherein the protrusion is sized to be press-fit into the recess.

28. The electrical connector as recited in claim 2, wherein the aperture defines a first cross-sectional shape, and the protrusion defines a second cross-sectional shape that is different than the first cross-sectional shape at a location at which the engagement members engage when the ground plate is attached to the dielectric housing.

29. The electrical connector as recited in claim 28, wherein the first housing surface is spaced from the second housing surface along a lateral direction, the electrical signal contacts define mating ends that are aligned along a transverse direction that is perpendicular to the lateral direction, and the first and second cross-sectional dimensions are along a plane that extends in the lateral and transverse directions.

30. The electrical connector as recited in claim 29, wherein the first cross-sectional shape is conical, and the second cross-sectional shape is rectangular.

31. The electrical connector as recited in claim 1, wherein the engagement member of the ground plate defines a first cross-sectional shape, and the engagement member of the dielectric housing defines a second cross-sectional shape that is different than the first cross-sectional shape at a location at which the engagement members engage when the ground plate is attached to the dielectric housing.

32. The electrical connector as recited in claim 31, wherein the first housing surface is spaced from the second housing surface along a lateral direction, the electrical signal contacts define mating ends that are aligned along a transverse direction that is perpendicular to the lateral direction, and the first and second cross-sectional dimensions are along a plane that extends in the lateral and transverse directions.

33. The electrical connector as recited in claim 32, wherein the first cross-sectional shape is conical, and the second cross-sectional shape is rectangular.

34. A leadframe assembly comprising:
a dielectric leadframe housing including a housing body that defines a first housing surface and a second housing surface opposite the first surface, wherein the housing body defines at least one protrusion extending out from the first surface;
a plurality of electrical signal contacts supported by the dielectric housing;
a ground plate including a ground plate body that defines a first plate body surface configured to face the first housing surface when the ground plate is secured to the dielectric leadframe housing and a second plate body surface opposite the first plate body surface, the ground plate including at least one rib that defines first and second opposed rib surfaces, wherein the first rib surface projects from the first plate body surface and the second rib surface is recessed into the second plate body surface,
wherein the ground plate defines at least one aperture extending through the rib, the aperture defining a first dimension along a select direction at the first plate body surface, and a second dimension along the select direction at the second plate body surface, such that the second dimension is less than the first dimension, such that the protrusion is configured to attach to the ground plate in the recess.

35. A ground plate configured to be secured to a dielectric housing of a leadframe assembly, the ground plate comprising a ground plate body that defines a first plate body surface configured to face the dielectric housing when the ground plate is secured to the dielectric housing and a second plate body surface opposite the first plate body surface, the ground plate including at least one rib that defines first and second opposed rib surfaces, wherein the first rib surface projects from the first plate body surface and the second rib surface is recessed into the second plate body surface,
wherein the ground plate defines at least one aperture extending through the rib, the aperture defining a first dimension along a select direction at the first plate body surface, and a second dimension along the select direction at the second plate body surface, such that the first dimension is greater than the second dimension.

36. The ground plate as recited in claim 35, wherein opposed surfaces of the ground plate body that partially define the aperture extend along axes that intersect each other.

37. A method of constructing a leadframe assembly comprising the steps of:
creating an aperture through an electrically conductive plate along a first direction from a first surface of the plate through an opposed second surface, such that the aperture defines a first dimension at the first surface and a second dimension at the second surface, wherein the first and second dimensions are measured along a second direction that is substantially perpendicular to the first direction;
after the creating step, increasing the first dimension and decreasing the second dimension.

38. The method as recited in claim 37, further comprising the step of embossing the electrically conductive plate at a region that defines the aperture so as to increase the first dimension and decrease the second dimension.

39. The method as recited in claim 37, wherein the region defines an entirety of the aperture.

40. The method as recited in claim 37, further comprising the step of supporting a plurality of electrical signal contacts in a dielectric housing.

41. The method as recited in claim 40, wherein the supporting step further comprises overmolding the dielectric housing to signal contacts.

42. The method as recited in claim 40, further comprising the step of receiving a protrusion of the dielectric housing in the aperture so as to secure the electrically conductive plate to the dielectric housing.

43. The method as recited in claim 42, wherein the receiving step further comprises receiving at least a portion of the protrusion through the first dimension of the aperture, and press-fitting the protrusion to the electrically conductive plate at the second dimension of the aperture.

44. The method as recited in claim 42, wherein the signal contacts define mating ends and opposed mounting ends, and the electrically conductive plate defines mating ends and opposed mounting ends, and the receiving step further comprises aligning the mating ends of the signal contacts with the mating ends of the electrically conductive plate, and aligning the mounting ends of the signal contacts with the mounting ends of the electrically conductive plate.

* * * * *

UNITED STATES PATENT AND TRADEMARK OFFICE
CERTIFICATE OF CORRECTION

| | |
|---|---|
| PATENT NO. | : 8,944,831 B2 |
| APPLICATION NO. | : 13/832096 |
| DATED | : February 3, 2015 |
| INVENTOR(S) | : Stuart C. Stoner et al. |

It is certified that error appears in the above-identified patent and that said Letters Patent is hereby corrected as shown below:

On the Title Page,
*Item (71) delete "Lweisberry, PA" and substitute therefore -- Lewisberry, PA --*

In the Claims,
*COL. 16, line 31-32 (claim 23) delete "includes discrete an electrical ground contact" and substitute therefor -- includes a discrete electrical ground contact --*

Signed and Sealed this
Twenty-eighth Day of June, 2016

Michelle K. Lee
*Director of the United States Patent and Trademark Office*